US012614578B2

(12) United States Patent
Liu et al.

(10) Patent No.: US 12,614,578 B2
(45) Date of Patent: Apr. 28, 2026

(54) MEMORY DEVICE, A MEMORY MODULE, A COMPUTING SYSTEM, A METHOD FOR ERASING A MEMORY PORTION OF A MEMORY DEVICE AND A METHOD FOR GENERATING AN ERASE REQUEST

(71) Applicant: Intel Corporation, Santa Clara, CA (US)

(72) Inventors: Shuo Liu, Shanghai (CN); Yao Zu Dong, Shanghai (CN); Qing Huang, Shanghai (CN); Kevin Yufu Li, Shanghai (CN); Yipeng Yao, Shanghai (CN); Jie Yu, Shanghai (CN)

(73) Assignee: Intel Corporation, Santa Clara, CA (US)

( * ) Notice: Subject to any disclaimer, the term of this patent is extended or adjusted under 35 U.S.C. 154(b) by 295 days.

(21) Appl. No.: 18/547,910

(22) PCT Filed: Mar. 26, 2021

(86) PCT No.: PCT/CN2021/083315
§ 371 (c)(1),
(2) Date: Aug. 25, 2023

(87) PCT Pub. No.: WO2022/198645
PCT Pub. Date: Sep. 29, 2022

(65) Prior Publication Data
US 2024/0185905 A1 Jun. 6, 2024

(51) Int. Cl.
*G11C 11/406* (2006.01)
*G11C 11/408* (2006.01)
*G11C 11/4096* (2006.01)

(52) U.S. Cl.
CPC ....... *G11C 11/40611* (2013.01); *G11C 11/408* (2013.01); *G11C 11/4096* (2013.01)

(58) Field of Classification Search
CPC ............. G11C 11/40611; G11C 11/408; G11C 11/4096
See application file for complete search history.

(56) References Cited

U.S. PATENT DOCUMENTS

| | | | |
|---|---|---|---|
| 2012/0063231 A1* | 3/2012 | Wood | G11C 11/5628 365/185.18 |
| 2014/0078830 A1 | 3/2014 | McCollum | |
| 2016/0163393 A1 | 6/2016 | Liang et al. | |

(Continued)

OTHER PUBLICATIONS

"Pmem.io Persistent Memory Programming", https://pmem.io/pmdk/, (archived at Wayback Machine, https://web.archive.org/web/20210227154002/https://pmem.io/pmdk/; Feb. 27, 2021), last accessed: Mar. 1, 2021.

(Continued)

*Primary Examiner* — Han Yang
(74) *Attorney, Agent, or Firm* — SPL Patent Attorneys PartG mbB; Yong Beom Hwang

(57) ABSTRACT

A memory device comprises an input interface configured to receive an erase request indicating a memory portion to be erased and control circuitry configured to trigger erasing information stored by memory cells of at least a part of the indicated memory portion of the memory device by writing a predefined pattern into the memory cells during an automatic refresh cycle.

20 Claims, 33 Drawing Sheets

(56) References Cited

U.S. PATENT DOCUMENTS

2016/0188221 A1* 6/2016 Janik .................... G06F 3/0611
711/103
2020/0363993 A1 11/2020 Choi et al.

OTHER PUBLICATIONS

Intel Corporation, "Intel Data Streaming Accelerator Architecture Specification", https://software.intel.com/content/www/us/en/develop/download/intel-data-streaming-accelerator-preliminary-architecture-specification.html, published: Oct. 2020, last accessed: Mar. 1, 2021.

Intel Corporation, "Intel Trust Domain Extensions", https://www.intel.com/content/dam/develop/external/us/en/documents/tdx-whitepaper-v4.pdf, last accessed: Mar. 1, 2021.

Intel Corporation, "Intel Architecture Memory Encryption Technologies Specification", https://software.intel.com/sites/default/files/managed/a5/16/Multi-Key-Total-Memory-Encryption-Spec.pdf?source=techstories.org, published: Apr. 2019, last accessed: Mar. 1, 2023.

Intel Corporation, "Intel 64 and IA-32 Architectures Software Developer's Manual—Combined vols. 1, 2A, 2B, 2C, 2D, 3A, 3B, 3C, 3D and 4", pp. 289, 741, https://software.intel.com/content/www/us/en/develop/download/intel-64-and-ia-32-architectures-sdm-combined-volumes-1-2a-2b-2c-2d-3a-3b-3c-3d-and-4.html, published: May 2020, last accessed: Mar. 10, 2021 (archived at Wayback Machine, https://web.archive.org/web/20200605184424/https://software.intel.com/content/www/us/en/ develop/download/intel-64-and-ia-32-architectures-sdm-combined-volumes-1-.

Mohsen Imani, Shruti Patil, Tajana Rosing, "Low Power Data Aware STT-RAM based Hybrid Cache Architecture", https://ieeexplore.ieee.org/document/7479181, Published in: 2016 17th International Symposium on Quality Electronic Design (ISQED), IEEE, DOI: 10.1109/ISQED.2016.7479181.

Bruce Jacob, Spencer W. Ng, David T. Wang, "Memory Systems—Cache, DRAM, Disk," pp. 364, 366, 433, Morgan Kaufmann Publications, published: 2008, ISBN: 978-0-12-379751-3.

* cited by examiner

INPUT INTERFACE 110

CONTROL CIRCUITRY 120

MEMORY CELLS 130

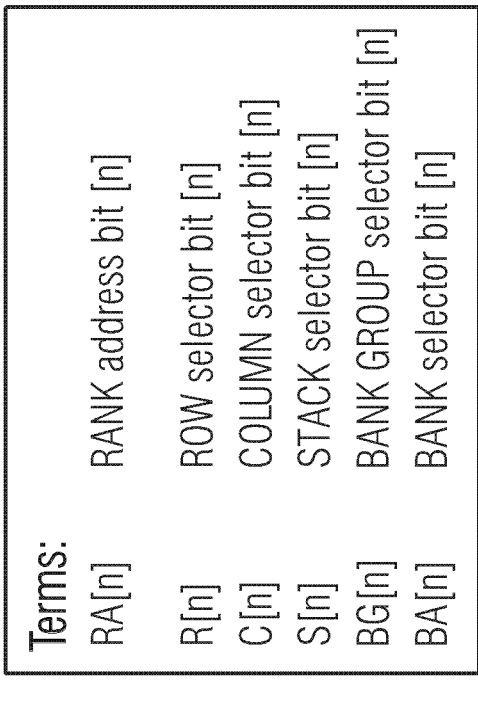
Terms:
RA[n]    RANK address bit [n]
R[n]    ROW selector bit [n]
C[n]    COLUMN selector bit [n]
S[n]    STACK selector bit [n]
BG[n]    BANK GROUP selector bit [n]
BA[n]    BANK selector bit [n]
FIG. 4B
| | | | | | | |
|---|---|---|---|---|---|---|
| R [0-17] | BA[0] | BG[1-2] | S [0-2] | | C [0-9] | BG[0] |
RA[37]
RA Block Selector
S_rab
RA[12]
RA Block Offset
RA[0]
FIG. 4A
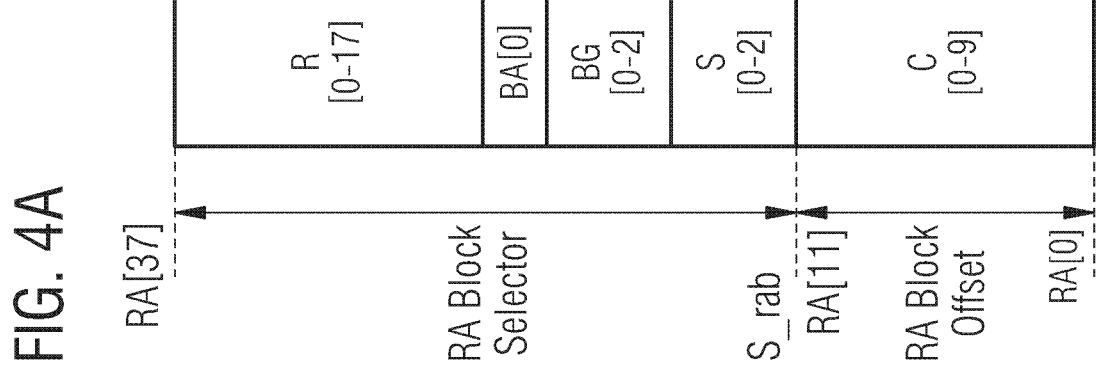
| | | | | | |
|---|---|---|---|---|---|
| R [0-17] | BA[0] | BG [0-2] | S [0-2] | | C [0-9] |
RA[37]
RA Block Selector
S_rab
RA[11]
RA Block Offset
RA[0]

INPUT
INTERFACE  ~1010

CONTROL
CIRCUITRY  ~1020

MEMORY
CELLS  ~130

| FIG. 20-1 |
|-----------|
| FIG. 20-2 |

FIG. 20-1

RA #0 / S_rab Block #0

RA #1 / S_rab Block #1

RA #0 / S_rab Block #0

RA #1 / S_rab Block #1

DIMM #1

RA #0 / S_rab Block #0

RA #1 / S_rab Block #1

RA #0 / S_rab Block #0

RA #1 / S_rab Block #1

DIMM #0

SubChannel Address (SCA #0)

SubChannel Address (SCA #1)

Channel Address (CA #0)

Physical Address (PA) / S_pab Block

FIG. 21

| FIG. 21-1 |
|-----------|
| FIG. 21-2 |

FIG. 21-1

DIMM #1

RA #0 / S_rab Block #0

RA #1 / S_rab Block #1

RA #0 / S_rab Block #0

RA #1 / S_rab Block #1

DIMM #0

RA #0 / S_rab Block #0

RA #1 / S_rab Block #1

RA #0 / S_rab Block #0

RA #1 / S_rab Block #1

SubChannel Address (SCA #0)

SubChannel Address (SCA #1)

Channel Address (CA #0)

Physical Address (PA) / S_pab Block full, symmetric inserted symmetric inserted equally inserted
(a whole DIMM is broken)

Well Fit Configurations outstanding small sized DIMM
(e.g. some RANK is disabled)

outstanding different parameter
DIMM (e.g. S_rab differs)

Not Fit Configurations

FIG. 24 A

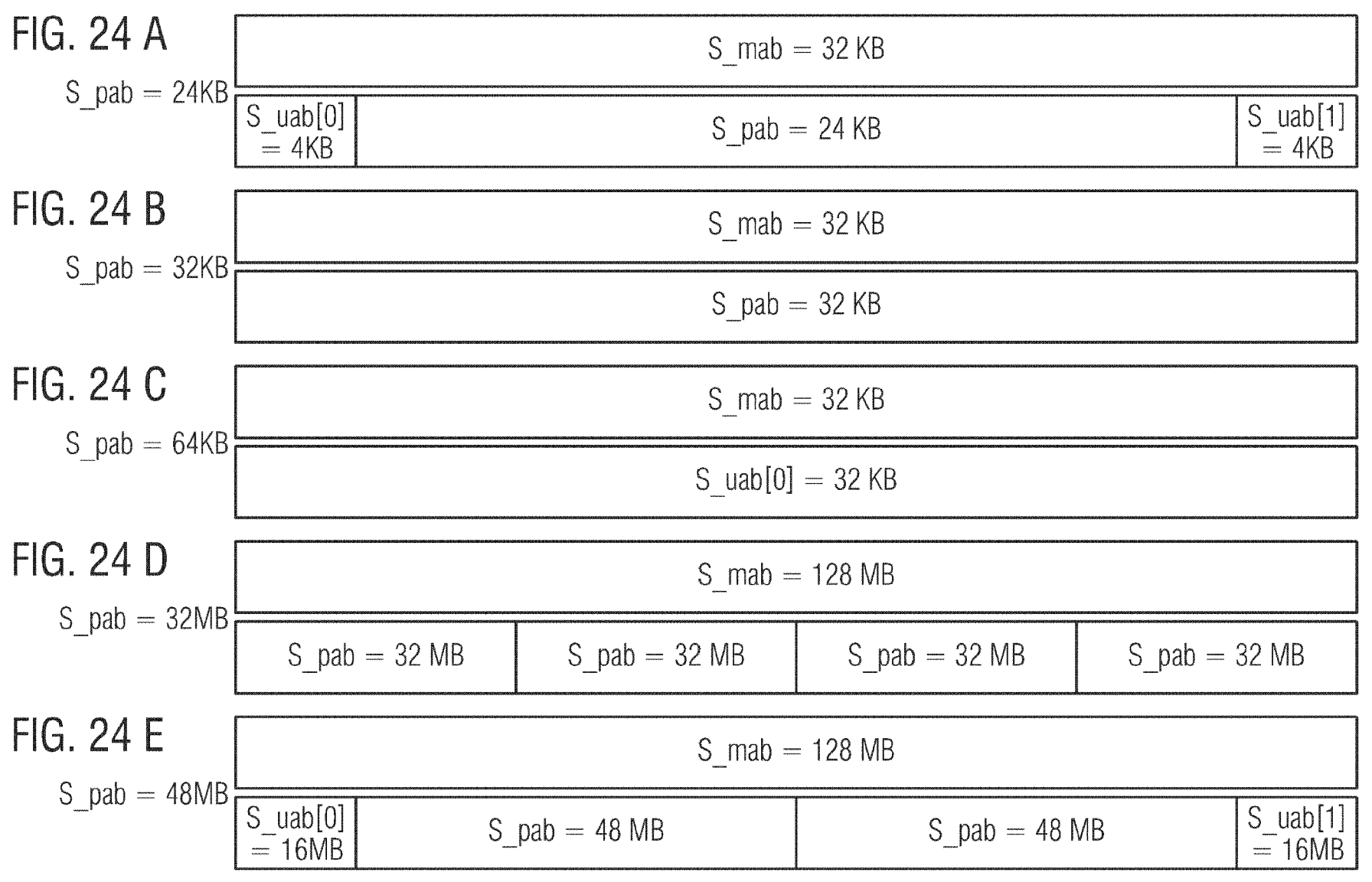

S_pab = 24KB

S_mab = 32 KB

S_uab[0] = 4KB

S_pab = 24 KB

S_uab[1] = 4KB

FIG. 24 B

S_pab = 32KB

S_mab = 32 KB

S_pab = 32 KB

FIG. 24 C

S_pab = 64KB

S_mab = 32 KB

S_uab[0] = 32 KB

FIG. 24 D

S_pab = 32MB

S_mab = 128 MB

S_pab = 32 MB

S_pab = 32 MB

S_pab = 32 MB

S_pab = 32 MB

FIG. 24 E

S_pab = 48MB

S_mab = 128 MB

S_uab[0] = 16MB

S_pab = 48 MB

S_pab = 48 MB

S_pab = 32 MB

S_uab[1] = 16MB

FIG. 27

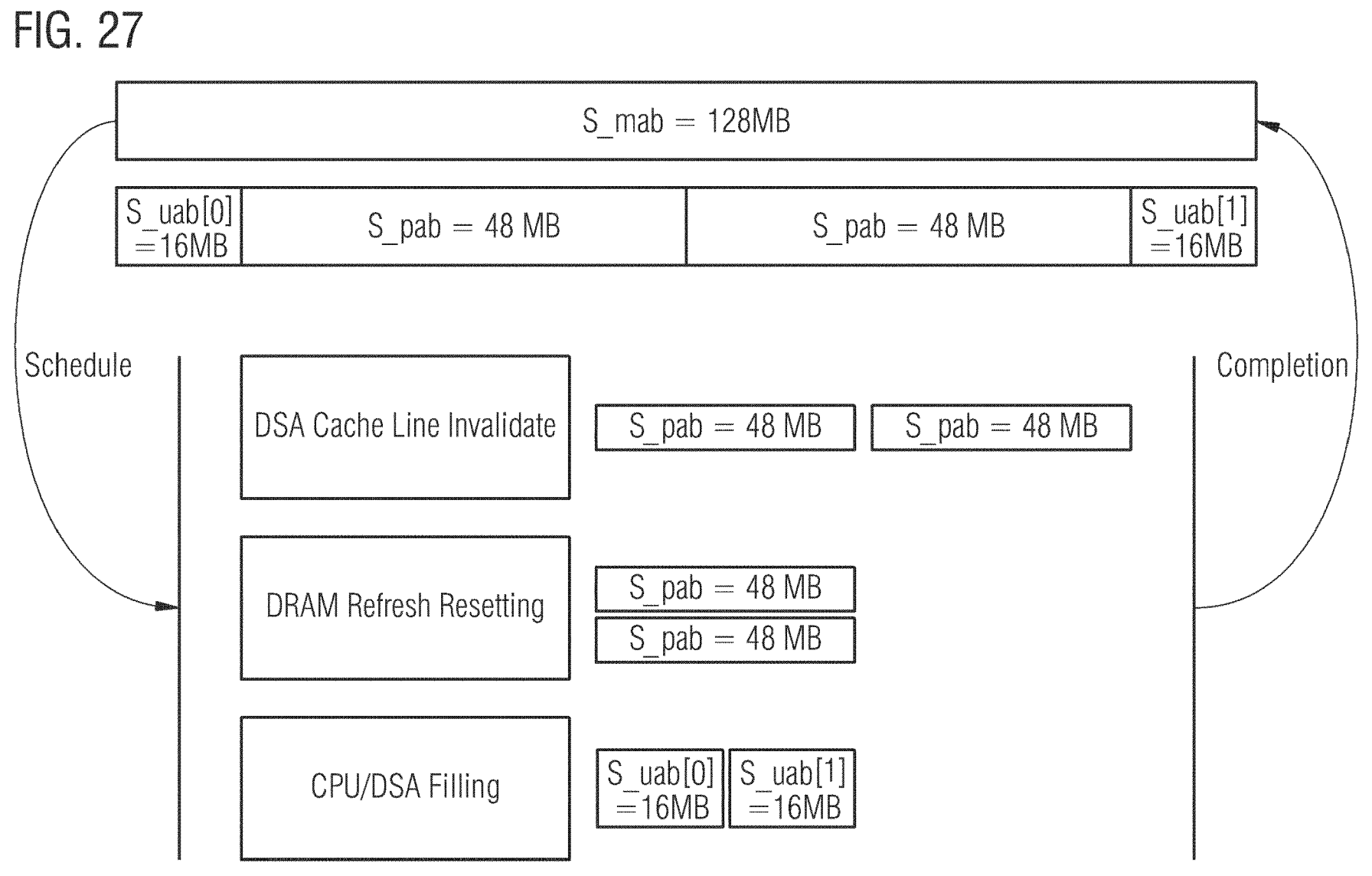

S_mab = 128MB

S_uab[0] = 16MB

S_pab = 48 MB

S_pab = 48 MB

S_uab[1] = 16MB

Completion

S_pab = 48 MB

DSA Cache Line Invalidate

S_pab = 48 MB

S_pab = 48 MB

S_pab = 48 MB

DRAM Refresh Resetting

S_uab[0] = 16MB

S_uab[1] = 16MB

CPU/DSA Filling

Schedule

2900

| receiving an erase request | — 2910 |

| erasing information stored by memory cells | — 2920 |

3000

| receiving an erase request | — 3010 |

| receiving a read or write request | — 3020 |

| triggering a reset of row buffers | — 3030 |

3100

| running an operating system | — 3110 |

| determining a memory block of a DIMM | — 3120 |

| generating a memory controller erase request | — 3130 |

MEMORY DEVICE, A MEMORY MODULE, A COMPUTING SYSTEM, A METHOD FOR ERASING A MEMORY PORTION OF A MEMORY DEVICE AND A METHOD FOR GENERATING AN ERASE REQUEST

FIELD

Examples relate to reset and erasure concepts for memories.

BACKGROUND

For example, stateless applications and services are deployed more and more in clouds, and may be a continuous trend for future large scale, high robustness cloud native usage. For stateless designs, a micro-service may be created, invoked and then destroyed in a short period of time, while all its private memory might need to be erased before being assigned for new usage. Otherwise, sensitive information of previous applications may be leaked. On the other hand, memory stressed computation may become more and more important along with the huge data generated everywhere in the digital world. An efficient reset concept for erasing memory content is desired.

BRIEF DESCRIPTION OF THE FIGURES

Some examples of apparatuses and/or methods will be described in the following by way of example only, and with reference to the accompanying figures, in which FIG. 1 shows a schematic illustration of a memory device;

FIGS. 4a and 4b show examples of low level memory mappings;

FIGS. 5a and 5b show examples of rank address blocks corresponding to the FIGS. 4a and 4b;

FIG. 10 shows a schematic illustration of a memory device;

FIG. 11 shows a schematic timing of a row buffer reset during read/write;

FIG. 16 shows a schematic illustration of another computing system;

FIG. 17 shows a schematic illustration of data transformation;

FIG. 24a-24e show examples of mappable address blocks;

FIG. 27 shows a schematic illustration of erasing a mappable address block;

DETAILED DESCRIPTION

Figure 2:
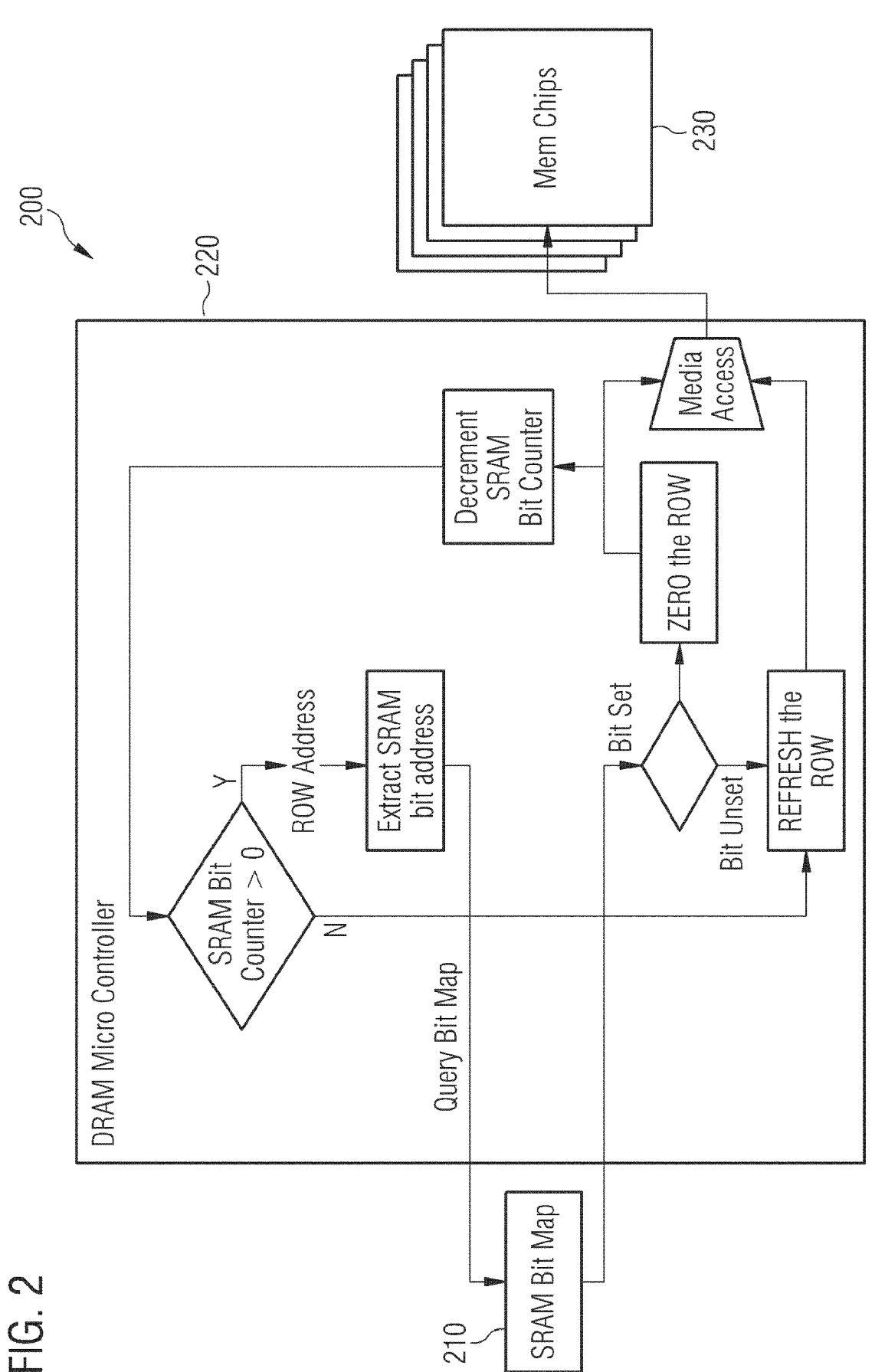
FIG. 2 shows a schematic illustration of another memory device.

Some examples are now described in more detail with reference to the enclosed figures. However, other possible examples are not limited to the features of these embodiments described in detail. Other examples may include modifications of the features as well as equivalents and alternatives to the features. Furthermore, the terminology used herein to describe certain examples should not be restrictive of further possible examples.

Throughout the description of the figures same or similar reference numerals refer to same or similar elements and/or features, which may be identical or implemented in a modified form while providing the same or a similar function. The thickness of lines, layers and/or areas in the figures may also be exaggerated for clarification.

When two elements A and B are combined using an 'or', this is to be understood as disclosing all possible combinations, i.e. only A, only B as well as A and B, unless expressly defined otherwise in the individual case. As an alternative wording for the same combinations, "at least one of A and B" or "A and/or B" may be used. This applies equivalently to combinations of more than two elements.

If a singular form, such as "a", "an" and "the" is used and the use of only a single element is not defined as mandatory either explicitly or implicitly, further examples may also use several elements to implement the same function. If a function is described below as implemented using multiple elements, further examples may implement the same function using a single element or a single processing entity. It is further understood that the terms "include", "including", "comprise" and/or "comprising", when used, describe the presence of the specified features, integers, steps, operations, processes, elements, components and/or a group thereof, but do not exclude the presence or addition of one or more other features, integers, steps, operations, processes, elements, components and/or a group thereof.

For example, requirements for memory erasing for memory stressed micro-services could be intensive. For a possible system configuration, one micro-service service may be backed by one virtual machine VM with a service span of 2 seconds and a new service instance may be launched immediately after the previous one stops. For example, before the launch of the new service instance, the memory of the previous service should be erased. Memory erasing may be fulfilled by filling zeros and may run with the full double data rate DDR bandwidth (e.g. 245.76 GB/s).

Figure 31:
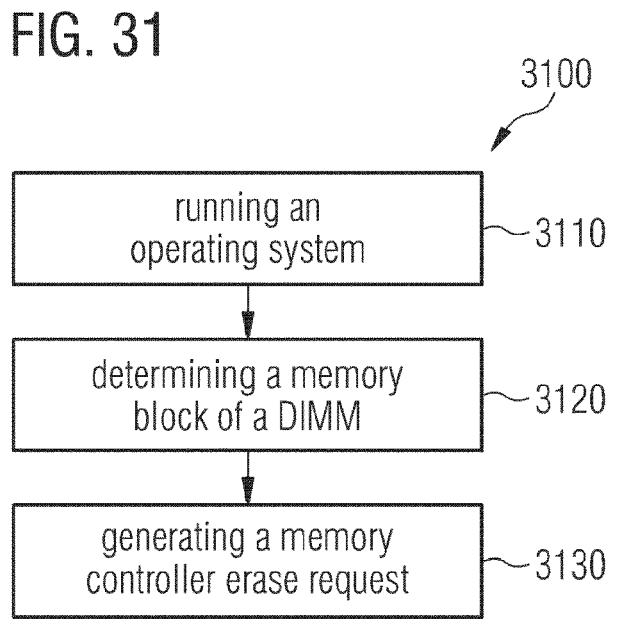
FIG. 31 shows a flow chart of a method for generating an erase request.
Figure 32:
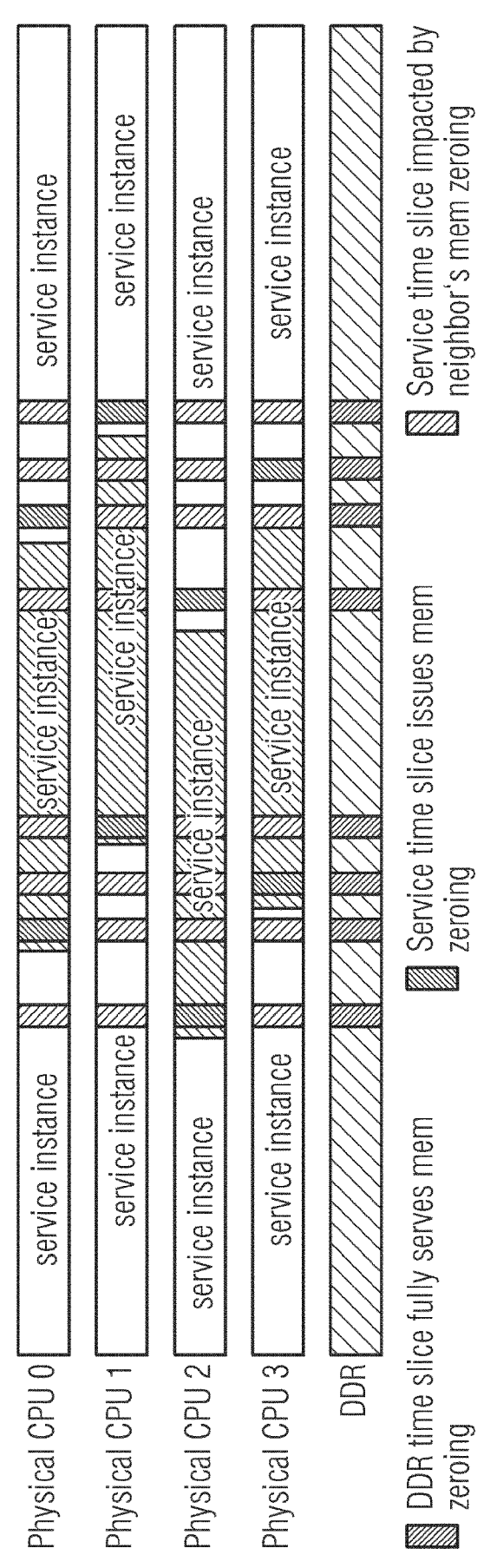
FIG. 32 shows a scaling of memory erasing overheads for multiple parallel services.

In this example, for a single service instance, the time to erase the memory may be several milliseconds. A fully utilized platform could have many service instances (e.g. VMs) running in parallel. Since the erasing operation takes the full DDR bandwidth, when one service instance is erasing, the other ones' memory accesses would have to wait. Hence, the overall erasing cost would significantly increase. This overhead may be big and might not only be a loss in service bandwidth, but may also cause performance jitter. FIG. 31 shows an example of the scaling of memory erasing overheads for multiple parallel services.

For server products running native containers with even higher service density, for future server product with increased physical core and/or channel density, and/or for micro-service configurations with bigger memory footprint, the overhead may further increase.

For micro-services protected by memory encryption, later service instances may access memory using keys different to previous ones, and hence the cleartext of previous instances cannot be directly obtained, for example. However, this might not be adequate. Ciphertext of memory contents encrypted by an old key and decrypted by a new key might be taken advantage of by a malicious service for ciphertext analysis to extract sensitive information. Sometimes, zeroing the content may be needed instead of only getting them destroyed (e.g. initialization of variables by zeroing). Memory erasing may be used at key changes.

For example, in cases where VM migration is used, and/or when an inadequate number of encryption keys is needed, and/or for performance reasons, the memory encryption may be disabled. Under these cases, the importance of memory erasing as protection against cross service information leakage is even higher.

The central processing unit CPU may be used for memory erasing (e.g. writing zero values using non-temporal hint to invalidate and bypass cache hierarchy into Dynamic Random Access Memory DRAM). Alternatively, a Data Streaming Accelerator DSA engine may be used for erasing. For example, DSA is a direct memory access DMA engine that can execute memory operations including memory filling. Both examples are in-band erasing techniques, where memory erasing traffic takes access cycles in system bus, memory controller and/or DRAM, for example. There might be contentions between erasing and other accesses and may cause a bandwidth loss and performance jitter. Further, using the CPU costs CPU cycles, which further reduces the service bandwidth, while using the DSA costs DSA cycles, which might contend with other DSA memory workloads (e.g. memory moving or comparison), for example.

A performance friendly rapid memory erasing technique may be desired.

Figure 1:
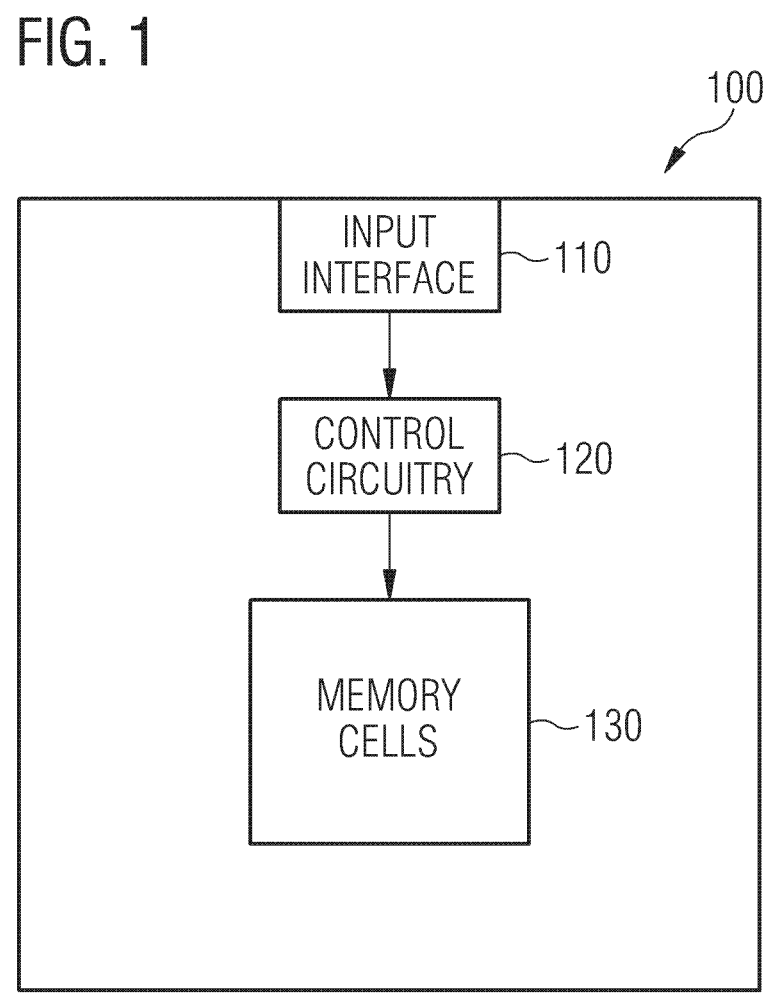

FIG. 1 shows a schematic illustration of a memory device 100. The memory device 100 comprises an input interface 110 connected to control circuitry 120. The input interface 110 is configured to receive an erase request indicating a memory portion to be erased. Further, the control circuitry 120 is configured to trigger erasing information stored by memory cells 130 of at least a part of the indicated memory portion of the memory device 100 by writing a predefined pattern into the memory cells 130 during an automatic refresh cycle.

By using the time of the automatic refresh cycle to erase memory cells, the access time for normal read or write requests may be increased. The memory device may be significantly less blocked by erase tasks. No or less performance overhead may occur, neither in form of bandwidth loss, nor jitters. If the memory erasing is carried out along with auto-refresh, no or less impact may be caused to in-band access cycles (e.g. normal read or write requests) of an system bus, a memory controller and/to a DRAM. An improved performance for micro-service quick launches may be obtainable. Memory erasing of single service instances may be completed within one automatic refresh cycle (e.g. 64 ms). For example, the time to erase many physical address blocks in a batch may still only cost one automatic refresh cycle. Further, the power consumption may be reduced, since memory erasing operations may use the DRAM auto-refresh power budget and might not cause extra power costs. Large-scale, high-density and memory-intensive secure micro-service may be enabled.

The erase request (or also called erase command) may be received from a memory controller, a CPU and/or a communication bus of a computing system. The erase request may comprise information on the memory portion of the memory device 100, which should be erased. The memory portion may be indicated by one or more memory block addresses of memory blocks to be erased. For example, the memory portion indicated by the erase request comprises one or more rank address blocks identified by one or more rank addresses. The erase request may include one or more rank addresses of rank address blocks of the memory device 100. For example, a memory block (e.g. rank address block) comprises a plurality of memory cells 130. A memory block (e.g. rank address block) may comprise at least one row of memory cells 130. For example, a size of the memory block (e.g. rank address block or s_rab) may be at most 100 MB (or at most 10 MB, at most 1 MB, at most 100 KB or at most 50 KB) and/or at least 1 KB (or 2 KB or 4 KB). For example, a memory cell comprises circuitry configured to store one bit. The erase request may comprise the information on the memory portion to be erased so that the control circuitry is able to identify the corresponding memory cells 130. The erase request may comprise memory stack information, memory bank group information, memory bank information and/or memory row information for at least the part of the memory block to be erased (e.g. rank address as in FIG. 4a or 4b).

Erasing (or also called resetting or deleting) the information stored by memory cells 130 may mean resetting the memory cells 130 by writing only zeros, only ones or any other random or meaningless pattern of bits into the memory cells 130. Consequently, the predefined pattern may be only zeros, only ones or any other random or meaningless pattern. The predefined pattern may be stored by the memory device, provided, set or selected through the input interface 110 or inherently given, if only zeros or only ones are used for erasing the information stored by memory cells 130. For example, the predefined pattern may be calculated by the control circuitry 120 based on information and/or rules stored by the memory device 100 when the erase is actually executed (e.g. FIG. 17). Erasing stored information may mean clearance of the memory contents from OS point of view by writing a predefined pattern such as zeros, ones or any other pattern without containing sensitive information of previous use and/or application. From DRAM point of view the term reset may mean to force the content of the DRAM to be 0 or other contents, if the DRAM hardware cells support such as SET. Both erasing and resetting may be used for the same meaning, for example, to overwrite the previous content of a specific memory block.

The control circuitry 120 may be configured to trigger erasing information stored by memory cells 130 by writing the predefined pattern in the row buffer of the memory cells 130 during automatic refresh so that the predefined pattern is written back into the memory cells 130 instead of the previously stored content. For example, the control circuitry 120 may be configured to trigger a reset of the row buffer of the memory cells 130 during automatic refresh. The reset of a row buffer may set the buffer to zero. In this example, the predefined pattern comprises only zeros.

The control circuitry 120 may be configured to trigger erasing the complete memory portion of the erase request, if the control circuitry 120 controls all memory cells of the memory portion. For example, the control circuitry 120 may be the micro controller of a DIMM and may be configured to trigger the erasing of the memory portion independent from whether the memory cells of the memory portion are located on only one memory die or distributed over several memory dies of the memory device 100. Alternatively, the control circuitry 120 may be configured to trigger erasing only a part of the memory portion of the erase request, if the control circuitry 120 controls only a part of the memory portion, while other parts of the memory portion are controlled by other circuitry. For example, the control circuitry 120 may be a controller of a memory die and may be configured to trigger the erasing of the part of the memory portion, which is located on the same memory die.

An automatic refresh (or also called auto refresh or memory refresh) may mean the process of periodically reading information from an area of computer memory and immediately rewriting the read information to the same area without modification, for the purpose of preserving the information. Dedicated time intervals may be used for the automatic refresh, which may be called automatic refresh cycles. The control circuitry 120 and/or auto-refresh circuitry may be configured to control the automatic refresh of the memory cells 130 of the memory device 100. All memory cells 130 of the memory device 100, all memory cells 130 of a memory die of the memory device 100 or a portion of the memory cells 130 of the memory device 100 may be refreshed during the automatic refresh cycle. The automatic refresh cycle may be shorter than 100 ms (or shorter than 150 ms or shorter than 80 ms, e.g. 64 ms). Erasing the information stored by memory cells 130 during an automatic refresh cycles may mean, instead of charging the memory cells as they are, the memory cells are charged by a pre-defined pattern, or any other equivalent patterns to destroy information stored on them. For example, the control circuitry 120 may be configured to trigger erasing information stored by memory cells 130 so that the memory cells 130 are erased while other memory cells of the memory device are refreshed during the automatic refresh cycle.

The memory device 100 may further comprise an auxiliary memory configured to store information on memory cells to be erased based on the erase request. For example, the auxiliary memory may store information on which memory cells should be erased after reception of the erase request and until the memory cells are actually erased during an automatic refresh cycle (e.g. during the next automatic refresh cycle after storing the information on memory cells to be erased). The auxiliary memory may be a static random-access memory SRAM. The auxiliary memory and the memory cells 130 to be erased and/or a micro controller (e.g. the control circuitry) of the memory device 100 may be implemented on the same memory die (e.g. FIG. 6). For example, the memory device 100 may comprise a plurality of auxiliary memories and each auxiliary memory of the plurality of auxiliary memories is assigned to an individual memory bank of the memory device 100. Alternatively, the auxiliary memory may be connected to a plurality of memory dies (e.g. FIG. 7 or 8). A first set of memory cells to be erased may be located on a first memory die of the plurality of memory dies and a second set of memory cells to be erased may be located on a second memory die of the plurality of memory dies.

The auxiliary memory may be configured to store an erase indication for a plurality of memory blocks based on one or more erase requests. For example, the auxiliary memory may comprise a plurality of bits. Each bit of the plurality of bits may be associated with a respective memory block. If a bit of the plurality of bits is set, the control circuitry 120 may trigger erasing of the corresponding memory block during the next automatic refresh cycle. For example, each bit of the auxiliary memory indicating memory cells to be erased may represent one row of memory cells or an integer multiple of rows of memory cells.

The auxiliary memory may be further configured to store a counter value indicating a number of memory blocks to be erased. For example, the counter value may be 0 or another predefined default value, if no memory block addressed by the auxiliary memory is requested to be erased. If at least one memory block is indicated to be erased, the counter value differs from 0 or the default value. For example, the counter value is equal to a number of memory blocks to be erased. The counter value may be decreased by 1 after erasing one memory block, which was indicated to be erased. For example, the control circuitry 120 may be configured to check whether memory cells scheduled for auto refresh during the automatic refresh cycle are indicated for erasure in the auxiliary memory, if the counter value indicates that at least one memory block is indicated to be erased. The control circuitry 120 may be configured to trigger erasing the information stored by the memory cells scheduled for auto refresh instead of performing the auto refresh during the automatic refresh cycle, if the memory cells scheduled for auto refresh are indicated for erasing in the auxiliary memory. If the counter value is zero (or the default value), the auxiliary memory might not need to be checked.

Auto refresh may be performed row by row or in a batched manner. A batch of rows of memory cells may be refreshed in parallel. The auxiliary memory may be structured in a way so that bits indicating rows of a refresh batch are located adjacent. For example, the control circuitry may be configured to trigger an automatic refresh of a batch of rows of memory cells during an automatic refresh cycle. The auxiliary memory may be configured to store information indicating whether the rows of the batch of rows of memory cells should be erased by adjacent bits of the auxiliary memory.

The memory device 100 may be a DRAM die or may be a memory module (e.g. Dual Inline Memory Module DIMM) comprising a plurality of DRAM dies. The memory cells 130 to be erased may be DRAM cells or other memory cells being repeatedly automatically refreshed.

The control circuitry 120 may be a microcontroller or memory controller of the memory device 100. The control circuitry 120 may be implemented on a memory die (e.g. DRAM die) or may be connected to a plurality of memory dies. The control circuitry 120 may be a microcontroller of a memory die (e.g. DRAM die) or a microcontroller of a memory module (e.g. DRAM module or DIMM module). The control circuitry 120 may be configured to control read requests, write requests and/or automatic refresh of the memory device 100.

The input interface 110 may be input circuitry or input-output circuitry. The input interface 110 may be an input interface or an input-output interface of a memory die (e.g. DRAM die) or a memory module (e.g. DRAM module or DIMM module) comprising a plurality of memory dies. The input interface 110 may be configured to be connected to a memory controller, a CPU and/or a communication bus of a computing system. The input interface 110 may be configured to receive signals from a memory controller, a CPU and/or a communication bus of a computing system. For example, the input interface 110 may be configured to provide a JEDEC mode register interface.

More details, optional features and aspects are mentioned in connection with one or more examples described above or below.

FIG. 2 shows a schematic illustration of a memory device 200. The memory device 200 may be implemented similar to the memory device described in connection with FIG. 1. The memory device 200 is a DRAM module comprising an auxiliary memory 210 connected to a DRAM micro controller 220. The DRAM micro controller 220 is connected to a plurality of memory chips 230 (e.g. memory dies) of the memory device 200.

The auxiliary memory 210 is an SRAM configured to store a counter and an SRAM bit map indicating memory blocks to be erased, if an erase request was received. For example, each SRAM bit of the SRAM bit map may represent one ROW or an integer multiple of ROWs. Alternatively, each SRAM bit of the SRAM bit map may represent 1/Nth of a ROW with N being an integer and/or an integer multiple (e.g. 1 time, 2 times, 4 times or any other integer multiple) of a CPU cache line size. An SRAM bit may be marked asynchronously by an erase request.

The DRAM micro controller 220 may check the counter at the beginning of an automatic refresh cycle. If the counter is larger than 0, the DRAM micro controller 220 may extract the SRAM bit address corresponding to a row address of a row planned for refresh and queries the SRAM bit map stored by the SRAM to find out whether the bit for the row address is set. If the bit is set, the row is zeroed through a media access interface. If the bit is unset, the row is refreshed through the media access interface. If a row is zeroed, the SRAM bit counter is decremented (e.g. by 1 for each zeroed row or memory block). If the counter is 0, the DRAM micro controller 220 can trigger the refresh without checking the SRAM bit map.

FIG. 2 may be an example of a DRAM Reset and Refresh process in Auto-Refresh Cycles. For example, the DRAM auto refresh operations are executed in units of ROW (or batch of ROWs). For example, for each ROW under execution, the DRAM microcontroller knows its {STACK, BANK GROUP, BANK, ROW} address and queries the corresponding SRAM bit. On bit=1, the ROW gets reset, on bit=0, the ROW gets refreshed, for example. Afterwards, the corresponding SRAM bit may be reset to 0.

During DRAM auto refresh, the microcontroller may check the counter. When the counter >0 (e.g. means that some reset requests are pending), the microcontroller may query the SRAM bit map for each ROW it operates on to decide to reset or refresh. For the completion of each ROW resetting, the counter may be decrement by 1. When the counter reaches 0, the whole SRAM may be reset to all 0 state (e.g. all pending requests are cleared).

When the counter=0 (e.g. means that no reset requests are pending), the microcontroller may directly execute refresh. When the counter >0, the SRAM may need to be queried and a tiny overhead may be introduced. This may increase the time portion used for auto-refresh and may decrease the DRAM bandwidth efficiency moderately. However, this may be worthwhile compared to the tremendous saving of in-band erasing costs.

For ROW resetting, pre-charge and access and sense may be skipped. All bit lines of a whole ROW could be charged directly to the 0-voltage (e.g. or a pattern by interleaved 0-voltages and 1-voltages).

More details, optional features and aspects are mentioned in connection with one or more examples described above or below.

Figure 3:
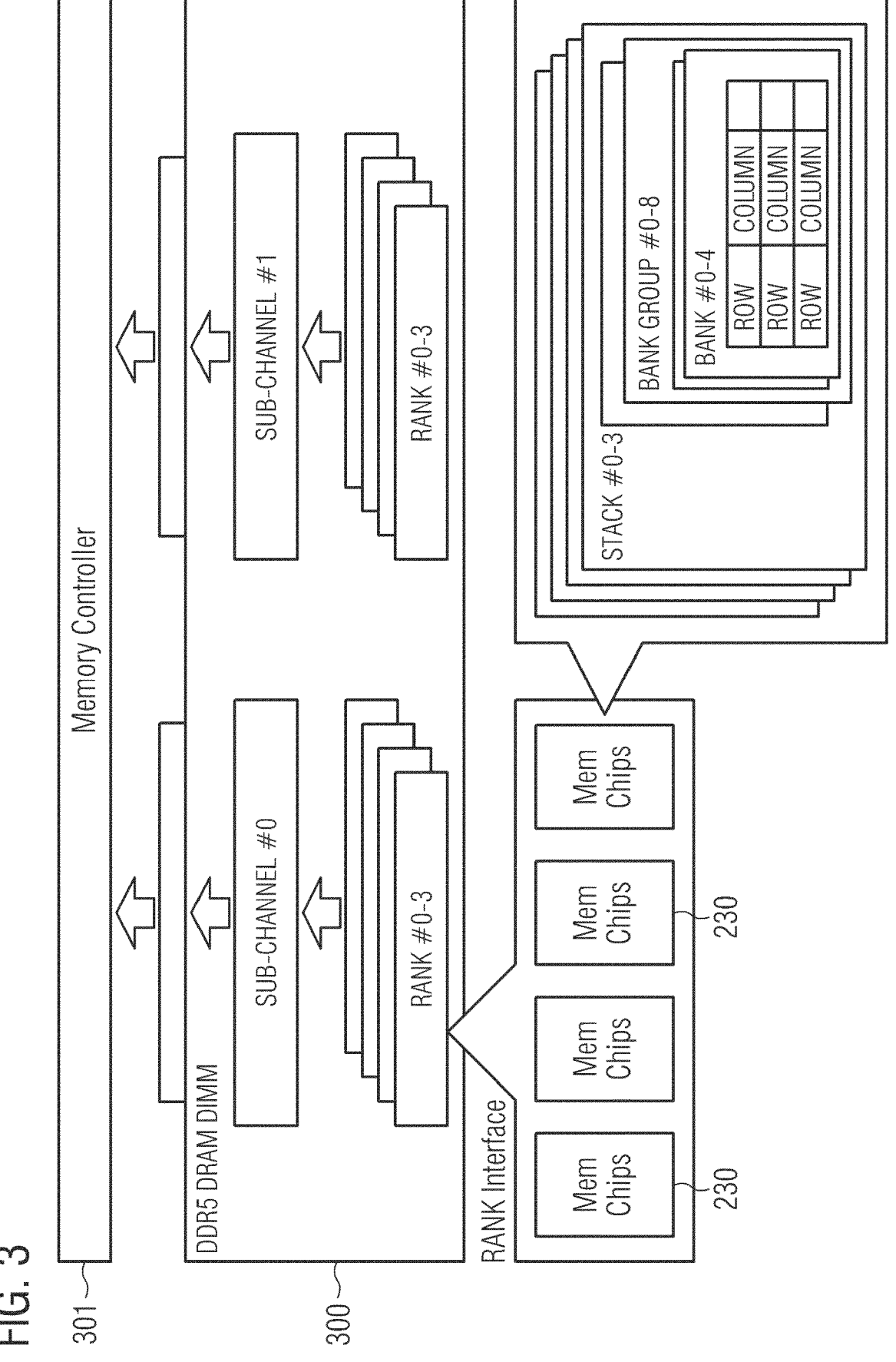
FIG. 3 shows a schematic illustration of an architecture of a Dual Inline Memory Module DIMM.

FIG. 3 shows a schematic illustration of an architecture of a Dual Inline Memory Module DIMM. The DIMM 300 may be implemented similar to the memory device described in connection with FIG. 1 or 2. The DIMM 300 may be connectable to a memory controller 301.

The DIMM 300 may be divided into two interleaved SUB-CHANNELs, and each SUB-CHANNEL may be interleaved by up to 4 equal-sized RANKs. RANK may be the basic unit of memory access control by a memory controller 301. Each RANK may comprise one or more memory chips 230. Each memory chip may comprise one or more stacks. Each stack may comprise one or more bank groups. Each bank group may comprise one or more banks. Each bank may comprise a plurality of memory cells.

Under RANK, the RANK Address (RA) may be further mapped to low level memory chip units (e.g. STACK, BANK GROUP, BANK, ROW and COLUMN). The basic unit of memory media access may be ROW, while for accessing the COLUMN data, the whole ROW may be read and buffered in a ROW buffer, and only the needed part is transmitted to or from a memory controller.

Figure 5A:
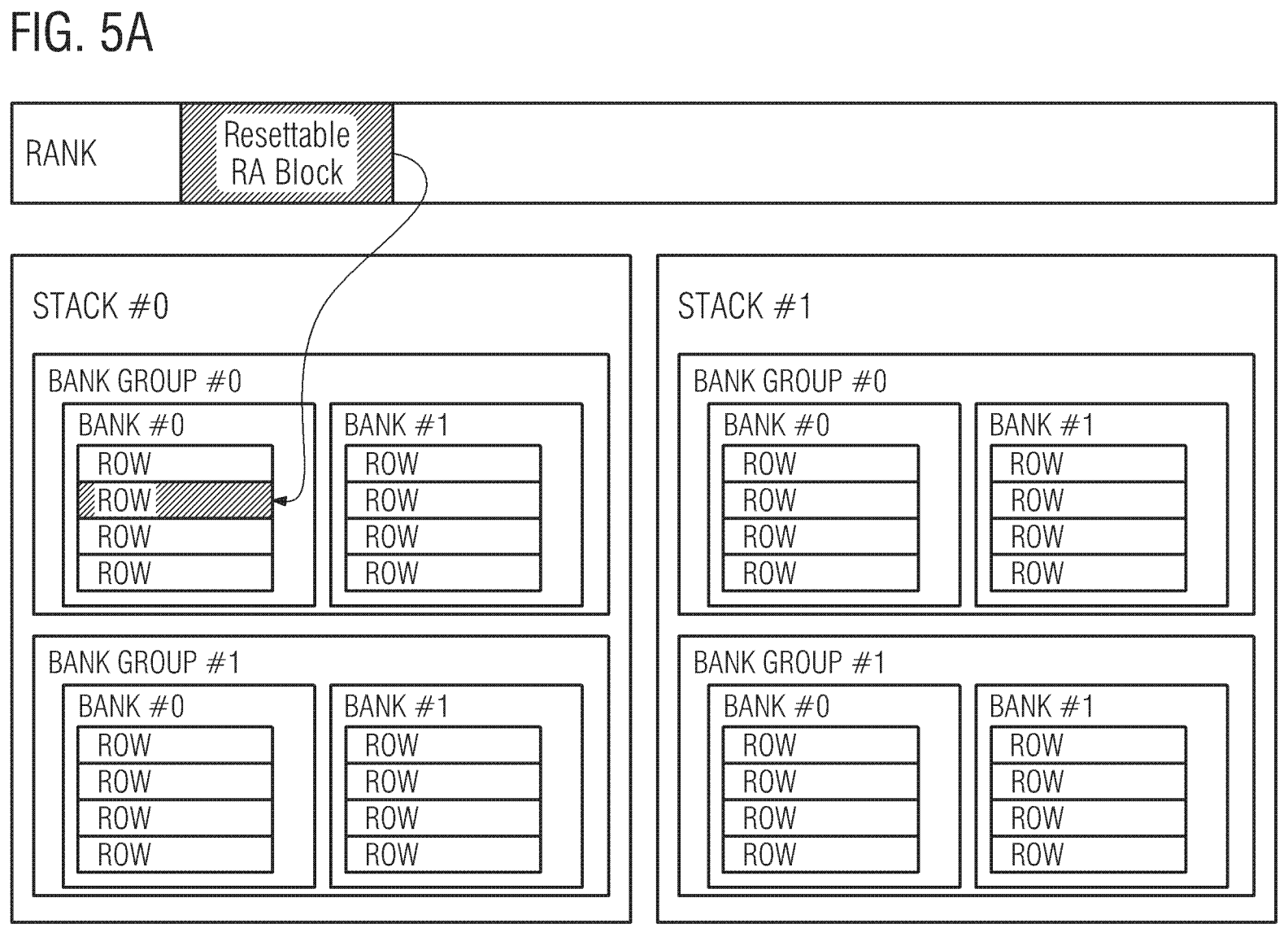
Figure 5B:
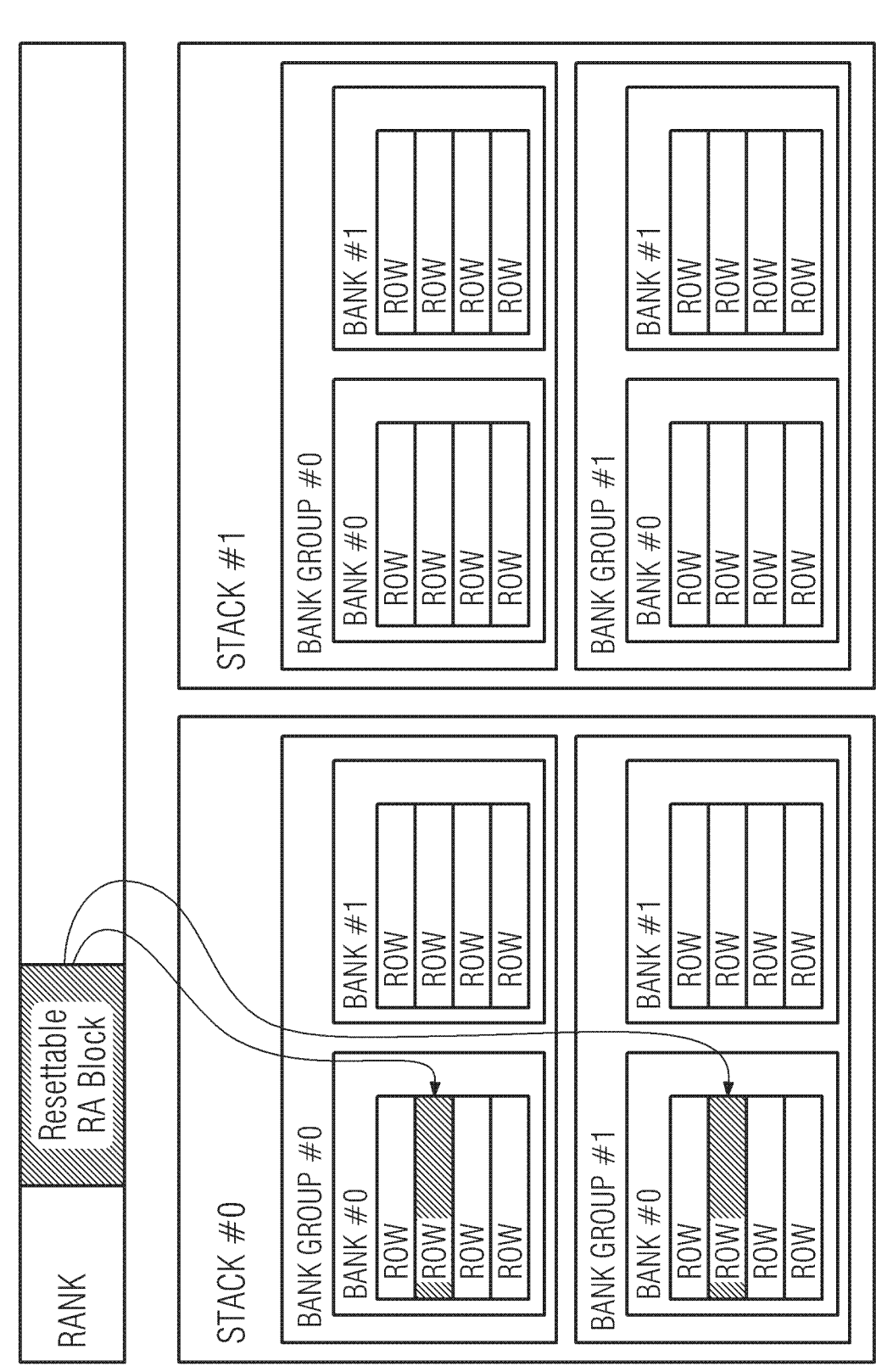

Access to STACK, BANK GROUP, BANK and ROWs may be interleaved (e.g. sequential access of adjacent RA addresses may be routed to different STACKs (S), BANK GROUPs (BG), BANKs (BA) and ROWs in a staggered way). The way of mapping may depend on memory controller page mapping strategies. FIGS. 4a and 4b show examples of low level memory mappings. The examples may show memory controller low level mapping strategies (e.g. RA to DRAM module) and/or memory controller page mapping strategies. FIG. 4a shows an example, which addresses single rows by the rank address. FIG. 5a illustrates an example of an addressed RA block by the mapping of FIG. 4a. The resettable RA block indicated a single specific row in a bank of a bank group of a stack. FIG. 4b shows an example, which addresses two rows by the rank address. FIG. 5b illustrates an example of an addressed RA block by the mapping of FIG. 4b. The resettable RA block indicates two specific rows in a bank of two different bank groups of a stack.

The size and alignment of a resettable RA block may be defined as S_rab. The resettable RA block (e.g. S_rab block) may have the characteristic that an S_rab block contains an integral multiple (e.g. 1, 2, 4, 8, 16 or more) of ROWs. The memory controller low level mapping may transform RANK address to DRAM address {STACK, BANK GROUP, BANK, ROW, COLUMN}. This mapping may be determined by the memory controller configuration. The memory controller low level mapping may determine S_rab. In some memory controller low level mapping configurations (e.g.

FIGS. 4*a* and 5*a*), the S_rab could contain only 1 ROW, forming finer erase granularity. In some memory controller low level mapping configurations (FIGS. 4*b* and 5*b*), a part of BA/BG/S bits may be mixed with C[0-9], forming bigger granularity. The low level mapping configuration of the memory controller may be designed to make sure the S_rab is as small as possible. These characteristics may guarantee that resetting of S_rab block could be executed in unit of ROWs, which might fit the working mechanism of DRAM micro-controllers as DRAM micro-controllers may access and refresh DRAM chips in ROW units. By S_rab, RA bits could be divided into RA block selector and RA block offset. For example, FIG. 4*a* may show an S_rab=4 KB. Alternatively, the S_rab can indicate identical sets of composing ROWs in each {STACK, BANK GROUP, BANK}. These characteristics may enable that resetting of S_rab block could be executed in unit of ROW at all composing {STACK, BANK GROUP, BANK} simultaneously, which might fit for the working mechanism of the auto-refresh by a DRAM microcontroller.

FIG. 3 may be an example for a DDR5 DRAM. For example, an Out-Of-Band (OOB) Resettable DRAM may be a DRAM with resettable RANK Address (RA) blocks. The DRAM architecture may provide the OS an interface to set the RA blocks to be reset and executes asynchronous resetting in subsequent auto-refresh cycle or combined with later ROW access operations (e.g. read or write request).

More details, optional features and aspects are mentioned in connection with one or more examples described above or below.

Figure 6:
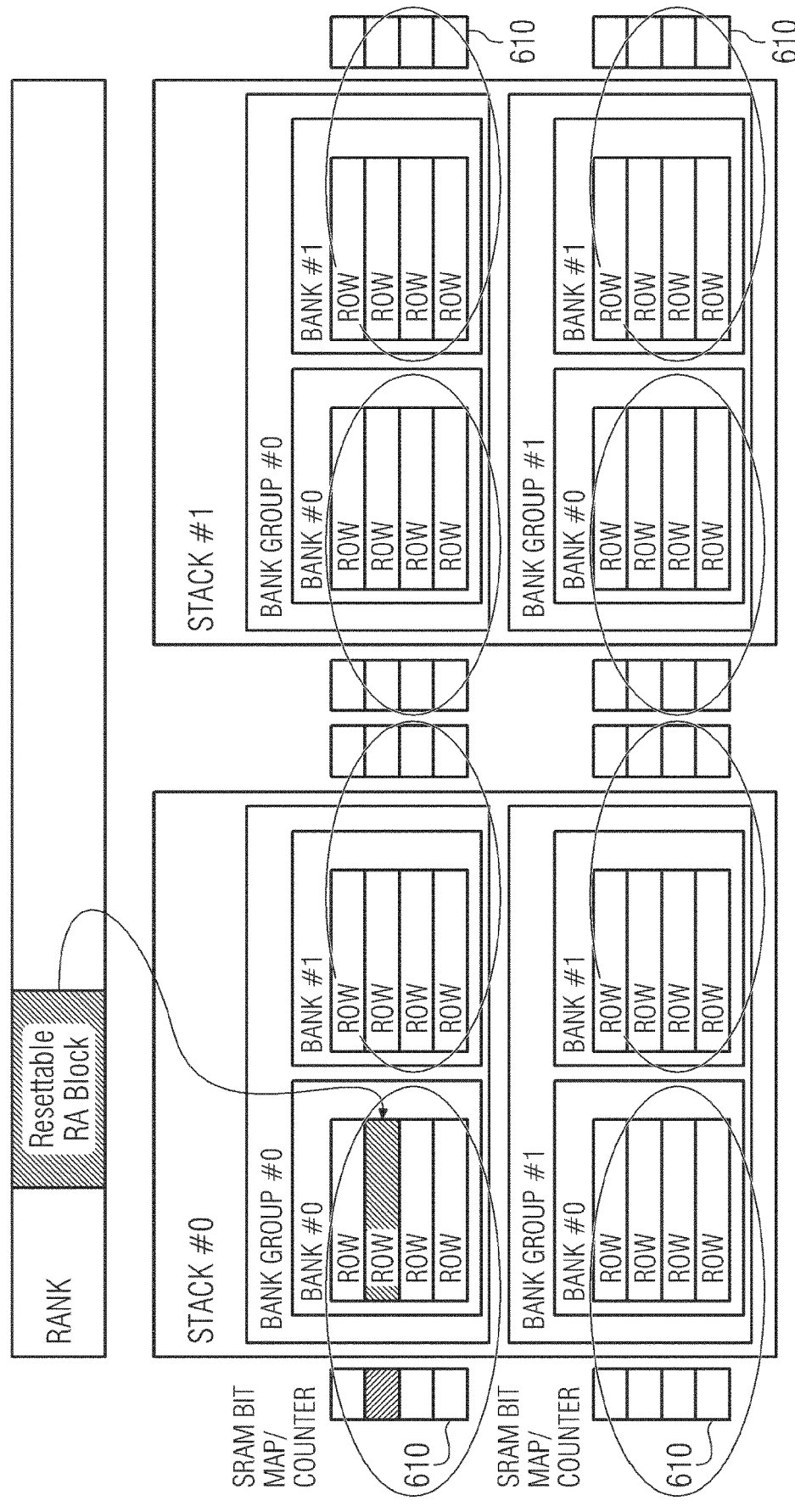
FIG. 6 shows a schematic illustration of a part of a Dynamic Random Access Memory DRAM with marked rank address block.

FIG. 6 shows a schematic illustration of a part of a memory device. The memory device may be implemented similar to the memory device described in connection with FIG. 1, 2 or 3. The memory device may be a Dynamic Random Access Memory DRAM with marked rank address block. The resettable RA block may be indicated by a received erase request. The resettable RA block may indicate a row in in a bank of a bank group of a stack. Each bank may have an associated auxiliary memory 610 indicating memory cells (e.g. rows or RA blocks) to be erased. The SRAM size may depend on the bank size. The SRAM per bank may have a size of less than 600 KB (or less than 300 KB, for example 256 KB).

The example shows an erase request indicating a row in stack 0, back group 0, bank 0 and the corresponding bit is set in the corresponding auxiliary memory.

For example, to fulfill the marking of S_rab blocks by the OS, an SRAM bit map (e.g. 1 bit per DRAM ROW) and a counter per SRAM (e.g. to record the number of bit set in the bit map) may be implemented in a per-BANK basis. A respective auxiliary memory storing a bit map and a counter may be assigned to each bank of memory cells of the DRAM die.

FIG. 6 may be an example of an OOB Resettable DRAM. The OS may program the SRAM bit map and/or counter via a memory controller into the OOB Resettable DRAM.

The OS to memory controller command may be in form of:

Action: ERASE BLOCK, parameter: physical address PA

PA may be the OS used Physical Address of the block to be erased. In the memory controller, as a part of a normal address translation, the PA may be transformed into a Channel Address (CA) and Rank Address (RA), and then into {STACK, BANK GROUP, BANK, ROW, COLUMN} to further instruct the DRAM DIMM.

The memory controller to DRAM command may be in form of:

Action: ERASE BLOCK, parameter: {STACK, BANK-GROUP, BANK, ROW}

DRAM micro-controller may use this information to get the BANK specific SRAM bit, and place the mark (e.g. as shown for a resettable RA in FIG. 6).

In some examples (e.g. FIGS. 4*a* and 5*a*), the full {STACK, BANKGROUP, BANK, ROW} bits may be used to produce the SRAM bit index. In some other examples (e.g. FIGS. 4*b* and 5*b*), a pair of SRAM bit indexes may be produced with assigning BG[0]=0 and 1, respectively. For this case, the memory controller may need to issue more than one command (e.g. two commands) to the DRAM, for example:

{ERASE BLOCK, {STACK, BG[2-1]0, BANK, ROW}
{ERASE BLOCK, {STACK, BG[2-1]1, BANK, ROW}

As a summary, memory controller may need to:

a. Upon receiving OS<->memory controller command, using its address transformation circuit to generate memory controller<->DRAM command
b. Referring to its low-level mapping configuration (e.g. FIG. 4*a* or 4*b*) to generate 1 or more memory controller<->DRAM commands.

SRAM access might not take the precious DRAM access cycles. SRAM access may be fast. For example, the 256 KB 6T-SRAM read and write latency may be <2 ns, respectively. For example, the SRAM bit set operation (e.g. read-update-write) may be <4 ns.

FIG. 6 may be an example of an OOB Resettable DRAM. For examples, FIGS. 7, 8 and/or 9 are examples for SRAM bit sharing (e.g. to build smaller SRAM sizes).

More details, optional features and aspects are mentioned in connection with one or more examples described above or below.

Figure 7:
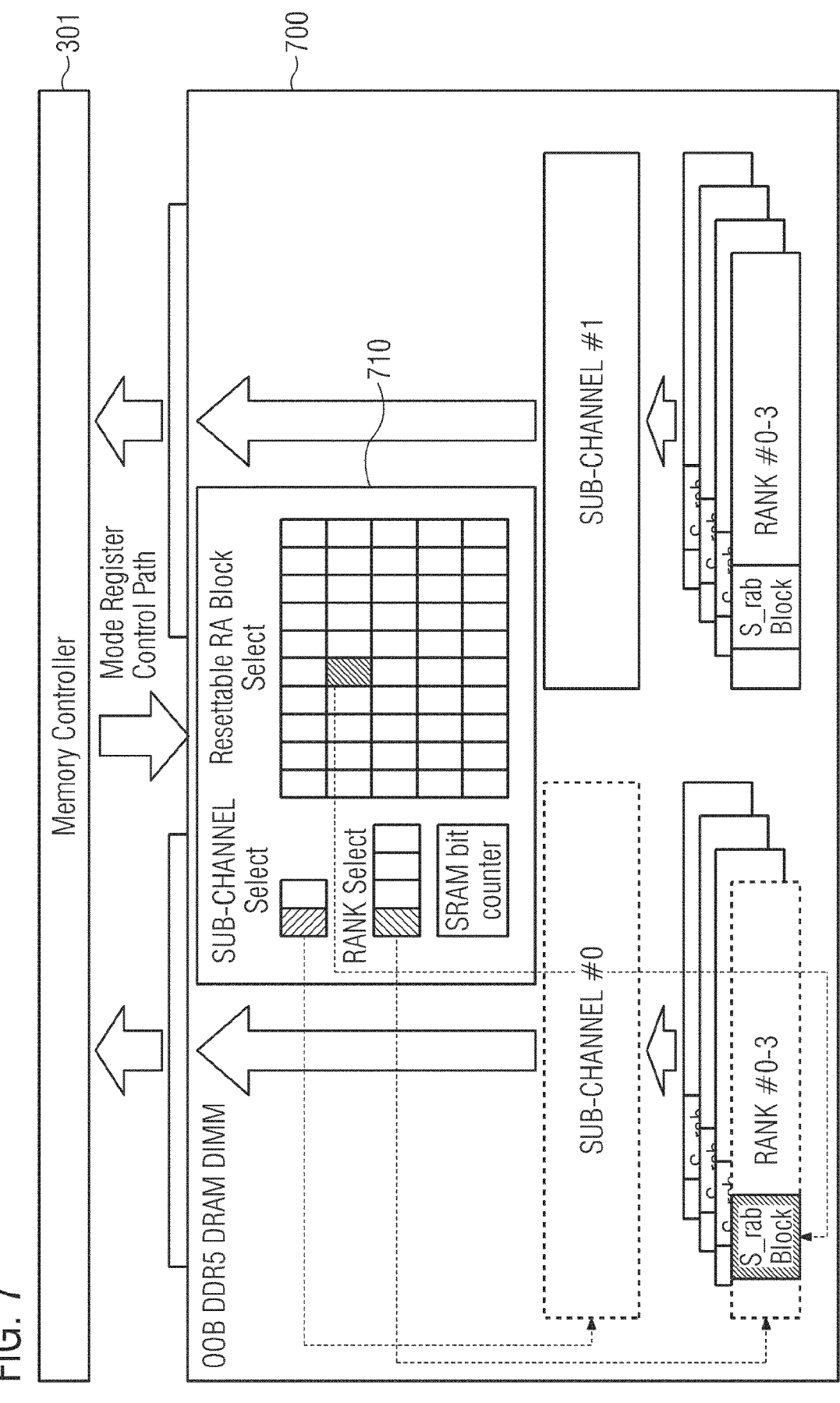
FIG. 7 shows a schematic illustration of a DIMM with auxiliary memory.

FIG. 7 shows a schematic illustration of a DIMM 700 with auxiliary memory. The DIMM 700 may be implemented similar to the memory device described in connection with FIG. 1, 2 or 3. The auxiliary memory 710 of the DIMM 700 is configured to store information on memory cells to be erased, which are located at different sub-channels and different ranks of the DIMM 700. The SRAM size may depend on the size of the DIMM memory. The SRAM may have a size of less than 70 MB (or less than 40 MB, for example 32 MB for a 1 TB DIMM).

To fulfill the marking of S_rab blocks by the OS, an SRAM bit map (e.g. 1 bit per s_rab), a counter to record the number of bit set in the bit map, a SUB-CHANNEL select register (e.g. 1 bit per SUB-CHANNEL) and a RANK select register (e.g. 1 bit per RANK) may be implemented into the DIMM 700 (e.g. OOB Resettable DRAM). The OS may program these registers via a memory controller through a JEDEC mode register interface.

More details, optional features and aspects are mentioned in connection with one or more examples described above or below.

Figure 8:
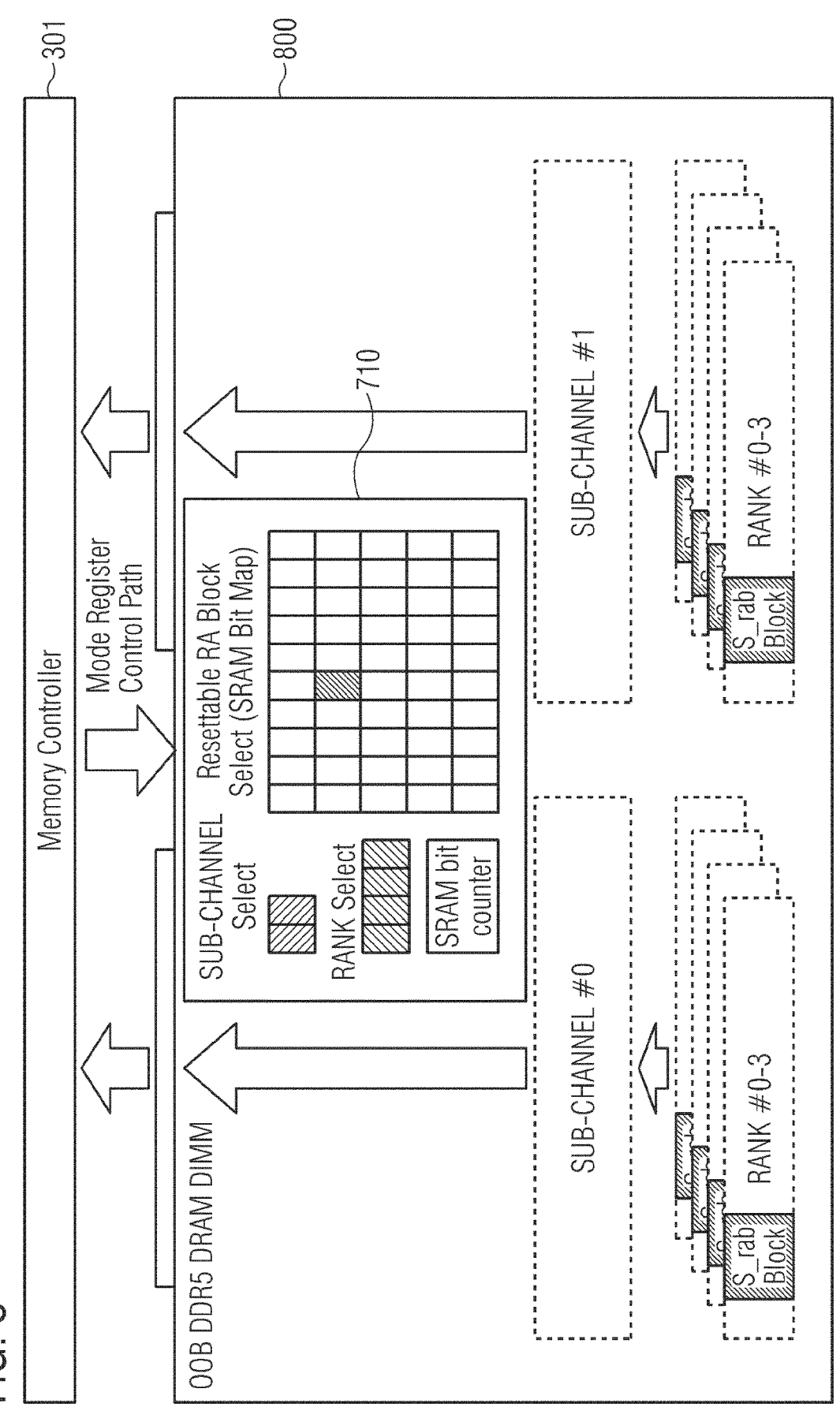
FIG. 8 shows a schematic illustration of another DIMM with auxiliary memory.

FIG. 8 shows a schematic illustration of a DIMM 800 with auxiliary memory. The DIMM may be implemented similar to the memory device described in connection with FIG. 7. FIG. 8 may be an example of an organization of an OOB DDR5 DRAM DIMM. Multiple S_rab blocks may be selected simultaneously.

More details, optional features and aspects are mentioned in connection with one or more examples described above or below.

Figure 9:
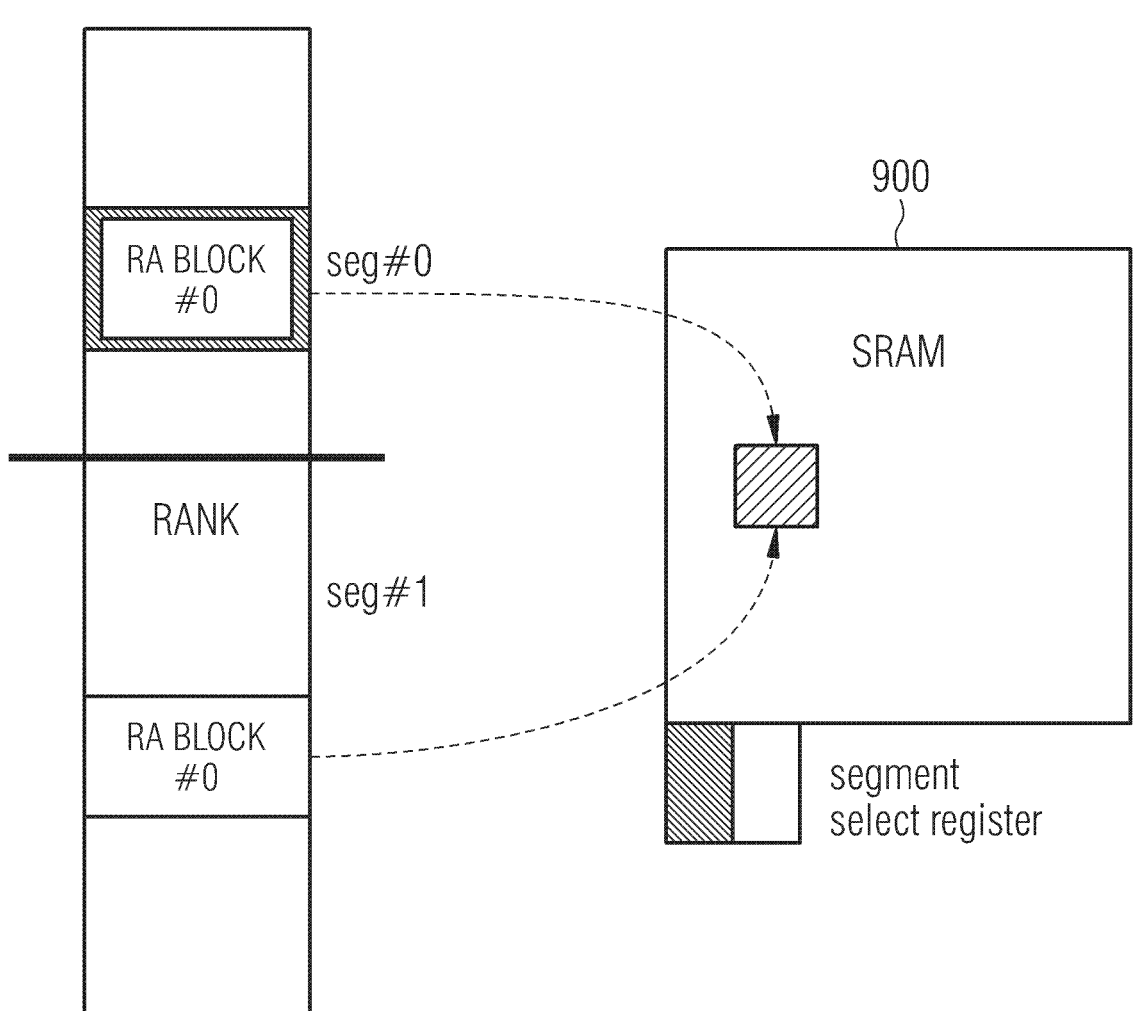
FIG. 9 shows a schematic illustration of an auxiliary memory.

FIG. 9 shows a schematic illustration of an auxiliary memory 900. The auxiliary memory 900 may be used for one or more of the examples described above or below. The size of the auxiliary memory (e.g. SRAM size) may depend on the DIMM parameters (e.g. DIMM size, number of sub-channels per DIMM, number of ranks per DIMM, size of S_rab).

The size of the auxiliary memory 900 may be reduced by segmenting the auxiliary memory. For example, the RA space may be equally divided into N segments and these segments share one SRAM bit resulting in further SRAM size saving by N times. An extra control register for segment selection may be implemented (e.g. 1 bit per segment). The OS may first select segment #0 and clear S_rab blocks belonged to segment #0, then resets segment #1, using two auto-refresh cycles in total, for example.

FIGS. 7, 8 and/or 9 may be an examples of an organization of an OOB DDR5 DRAM DIMM. The OOB Resettable DRAM may provide a mechanism for the OS to discover its resetting capability. In some examples, the capability descriptor could be stored in the on-DIMM Serial Presence Detect (SPD) Electrically Erasable Programmable Read Only Memory (EEPROM). At boot time, the BIOS may read the SPD EEPROM info and further report the capability to the OS via the Advanced Configuration and Power Interface ACPI. The OS may enable the resetting control or may ignore the capability and use the OOB Resettable DRAM just as normal DRAM. OOB reset-ability as a DRAM capability info may be queried and/or may be set enabled/ disabled by the BIOS.

Figure 10:
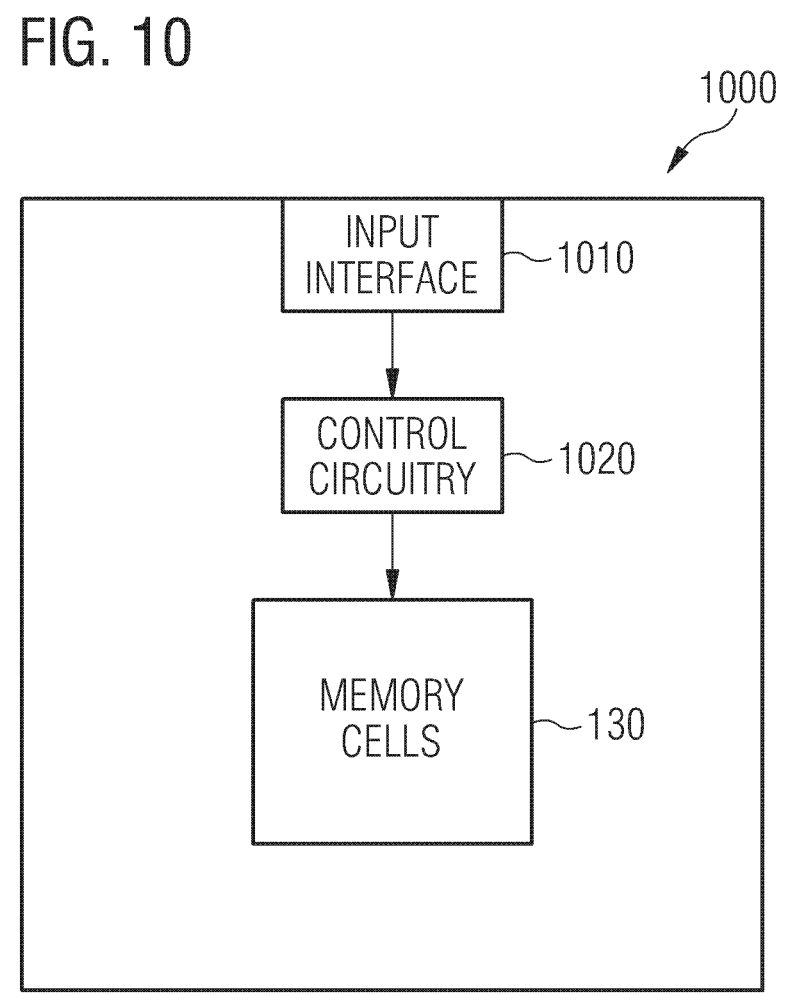

FIG. 10 shows a schematic illustration of a memory device 1000. The memory device 1000 comprises an input interface 1010 configured to receive an erase request indicating at least a part of one row of memory cells 130 to be erased. Further, the input interface is configured to receive a read or write request for at least a part of a row of memory cells 130. Additionally, the memory device 1000 comprises control circuitry 1020 configured to trigger a reset of at least a part of a row buffer of a memory array comprising the row of memory cells 130 indicated by the read or write request based on a predefined pattern during a read or write cycle assigned for the received read or write request and before outputting of information stored by one or more memory cells 130 indicated by the read or write request or before inputting information to be stored by one or more memory cells 130 indicated by the read or write request, if an erase request was received for at least a part of the row of memory cells 130 indicated by the read or write request.

By using the time of a read or write operation to erase memory cells, the access time for normal read or write requests (without erasing memory cells) may be increased. The memory device may be significantly less blocked by erase tasks. No or less performance overhead may occur, neither in form of bandwidth loss, nor jitters. If the memory erasing is carried out along with a read or write operation, no or less impact may be caused to in-band access cycles (e.g. normal read or write requests) of a system bus, a memory controller and/to a DRAM. An improved performance for micro-service quick launches may be obtainable.

The erase request (or also called erase command) may be received from a memory controller, a CPU and/or a communication bus of a computing system. The erase request may comprise information on the memory portion of the memory device 1000, which should be erased. The memory portion may be indicated by one or more memory block addresses of memory blocks to be erased. For example, the memory portion indicated by the erase request comprises one or more rank address blocks identified by one or more rank addresses. In other words, the erase request may include one or more rank addresses of rank address blocks of the memory device 1000. A memory block (e.g. rank address block) may comprise at least one row of memory cells 130 or a part of a row (e.g. 1/Nth of a row) of memory cells. For example, a size of the memory block (e.g. rank address block or s_rab) may be at most 100 MB (or at most 10 MB, at most 1 MB, at most 100 KB or at most 50 KB) and/or at least 1 KB (or 2 KB or 4 KB). The erase request may comprise memory stack information, memory bank group information, memory bank information and memory row information for at least the part of the memory block to be erased (e.g. rank address as in FIG. 4a or 4b).

The read or write request may be received from a memory controller, a CPU and/or a communication bus of a computing system. The read or write request may comprise information on the memory portion, which should be read or which should be written with new content. The memory portion may be indicated by one or more memory block addresses of memory blocks. For example, the memory portion indicated by the read or write request comprises one or more rank address blocks identified by one or more rank addresses.

Resetting the row buffer based on a predefined pattern may mean writing the predefined pattern into the row buffer and erasing the previously stored content. The predefined pattern may be only zeros, only ones or any other random or meaningless pattern.

The control circuitry 1020 may be configured to trigger the reset before outputting of information stored by one or more memory cells indicated by the read or write request, if the read or write request is a read request. The control circuitry 1020 may be configured to trigger the reset before inputting information to be stored by one or more memory cells indicated by the read or write request, if the read or write request is a write request.

The size and alignment of a resettable RA block (e.g. a memory block to be erased) may be defined as S_rab. The resettable RA block (e.g. S_rab block) may have the characteristic that an S_rab block contains an integral multiple (e.g. 1, 2, 4, 8, 16 or more) of ROWs or M 1/Nth of a ROW with M and N being integers larger than 0.

The memory device 1000 may further comprise an auxiliary memory configured to store information on memory cells to be erased based on the erase request. For example, the auxiliary memory store information on memory cells to be erased after reception of the erase request and until the memory cells are actually erased during a read or write cycle. The auxiliary memory may be a static random-access memory SRAM. The auxiliary memory and the memory cells 130 to be erased and/or a micro controller (e.g. the control circuitry) of the memory device 1000 may be implemented on the same memory die (e.g. FIG. 6). For example, the memory device 1000 may comprise a plurality of auxiliary memories and each auxiliary memory of the plurality of auxiliary memories is assigned to an individual memory bank of the memory device 1000. Alternatively, the auxiliary memory may be connected to a plurality of memory dies (e.g. FIG. 7 or 8). A first set of memory cells to be erased may be located on a first memory die of the plurality of memory dies and a second set of memory cells to be erased may be located on a second memory die of the plurality of memory dies.

The auxiliary memory may be configured to store an erase indication for a plurality of memory blocks based on one or more erase requests. For example, the auxiliary memory may comprise a plurality of bits. Each bit of the plurality of bits may be associated with a respective memory block. If a bit of the plurality of bits is set, the control circuitry 1020 may trigger erasing of the corresponding memory block during a read or write cycle for this memory block. For example, each bit of the auxiliary memory indicating memory cells to be erased may represent one row of memory cells, an integer multiple of rows of memory cells. Alternatively, each bit of the auxiliary memory indicating memory cells to be erased may represent 1/Nth of a row of memory cells with N being an integer (e.g. 1, 2, 3, 4, 8, 16 or any other integer) and/or an integer multiple of a CPU cache line size.

The auxiliary memory may be further configured to store a counter value indicating a number of memory blocks to be erased. For example, the counter value may be 0 or another predefined default value, if no memory block addressed by the auxiliary memory is requested to be erased. If at least one memory block is indicated to be erased, the counter value differs from the default value. For example, the counter value is equal to a number of memory blocks to be erased. The counter value may be decreased by 1 after erasing of a memory block, which was indicated to be erased. For example, the control circuitry 1020 may be configured to check whether memory cells scheduled for read or write during a read or write cycle are indicated for erasure in the auxiliary memory, if the counter value indicates that at least one memory block is indicated to be erased. If the counter value is zero (or the default value), the auxiliary memory might not need to be further checked.

The memory device 1000 may be a DRAM die or a non-volatile memory die (e.g. flash memory die) or may be a memory module (e.g. Dual Inline Memory Module DIMM) comprising a plurality of DRAM dies or non-volatile memory dies. The memory cells 130 to be erased may be DRAM cells or other memory cells (e.g. NAND cells, persistent memory cells or flash memory cells).

The control circuitry 1020 may be a microcontroller or memory controller of the memory device 1000. The control circuitry 1020 may be implemented on a memory die (e.g. DRAM die) or may be connected to a plurality of memory dies. The control circuitry 1020 may be a microcontroller of a memory die (e.g. DRAM die) or a microcontroller of a memory module (e.g. DRAM module or DIMM module). The control circuitry 1020 may be configured to control read requests, write requests and/or automatic refresh of the memory device 1000.

The input interface 1010 may be input circuitry or input-output circuitry. The input interface 1010 may be an input interface or an input-output interface of a memory die (e.g. DRAM die) or a memory module (e.g. DRAM module or DIMM module) comprising a plurality of memory dies. The input interface 1010 may be configured to be connected to a memory controller, a CPU and/or a communication bus of a computing system. The input interface 1010 may be configured to receive signals from a memory controller, a CPU and/or a communication bus of a computing system. For example, the input interface 1010 may be configured to provide a JEDEC mode register interface.

A row buffer of a memory array may be circuitry configured to store the content of a row of memory cells for subsequent output or refresh of the memory cells or store information to be written into a row of memory cells. The row buffer may comprise a register (e.g. with faster access than the memory cells) for each column of the memory array. For example, a memory array comprises a plurality of rows and columns of memory cells.

More details, optional features and aspects are mentioned in connection with one or more examples described above or below.

Figure 11:
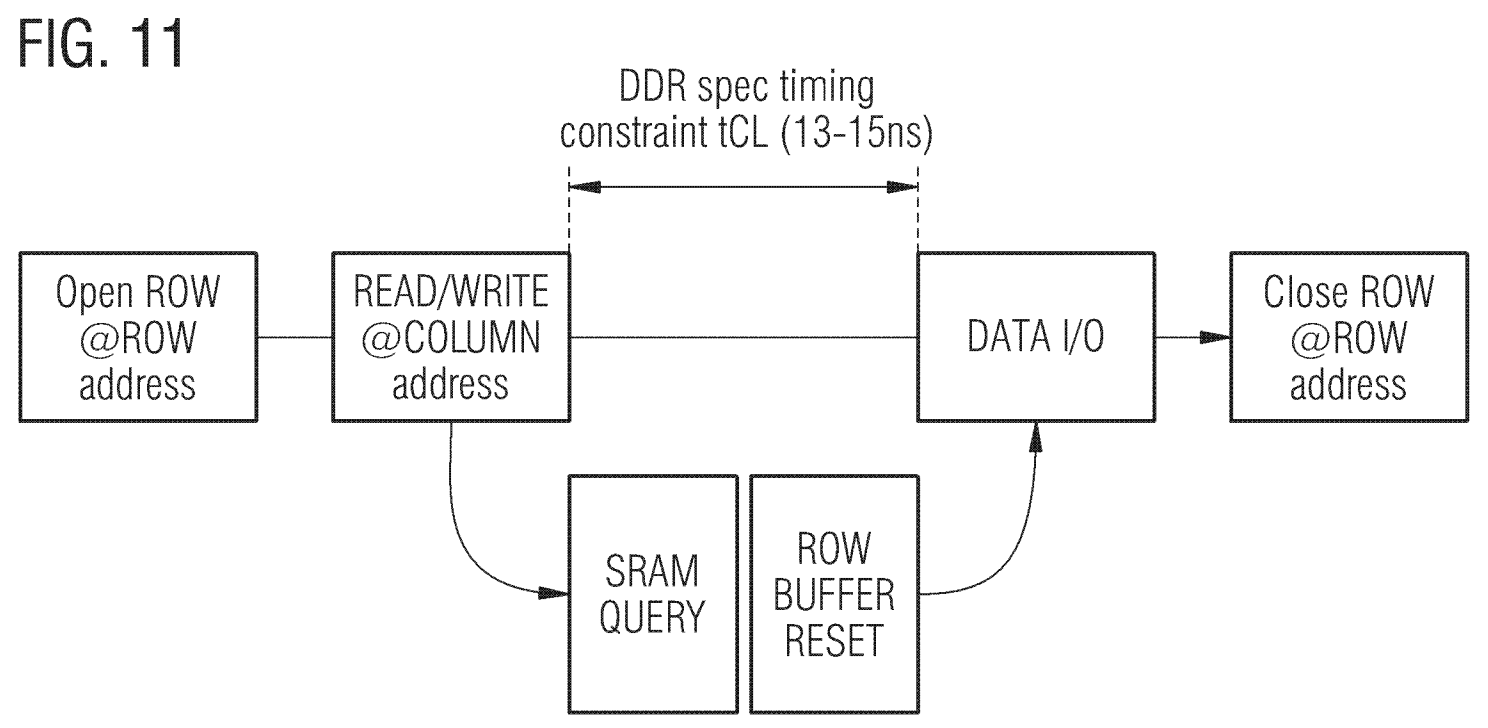

FIG. 11 shows a schematic timing of a row buffer reset during read and/or write of a DRAM. After receiving a read or write request for a row, the row at the row address is opened (e.g. the content of the memory cells is loaded into the row buffer). Then the read or write for the column address is prepared. The DRAM may use the time tCL or tCWL between the start of the preparation for the read or write and the data input or output I/O to query the SRAM (auxiliary memory) and the row buffer can be reset, if the row is indicated for erasure in the SRAM. If one SRAM bit indicates 1 or multiple ROWs erasure status, the whole ROW buffer may be reset. If one SRAM bit indicates 1/Nth of ROWs erasure status, the corresponding part of the ROW may be reset. Especially if one SRAM bit indicates 1/Nth of ROWs erasure status and equals to one cache line size, the ROW buffer reset may be skipped, since the subsequent data I/O may be also in one cache line size unit. For read, an all-0 cache line may be returned. For write, the incoming cache line may be merged into the ROW buffer. The time tCL or tCWL (e.g. 13-15 ns) may be the DRAM latency between read or write command and the actual data input or output, which may be a double data rate DDR specific timing constraint. After the data I/O, the row at the row address is closed (e.g. the content of the row buffer is written into the memory cells of the row).

For example, the reset may be triggered by an erase request (e.g. sent ahead of time and stored in the SRAM). A subsequent read and write might query the SRAM to check whether there is a pending erase request and a row buffer may be reset before data I/O occurs to the bus.

More details, optional features and aspects are mentioned in connection with one or more examples described above or below.

Figure 12:
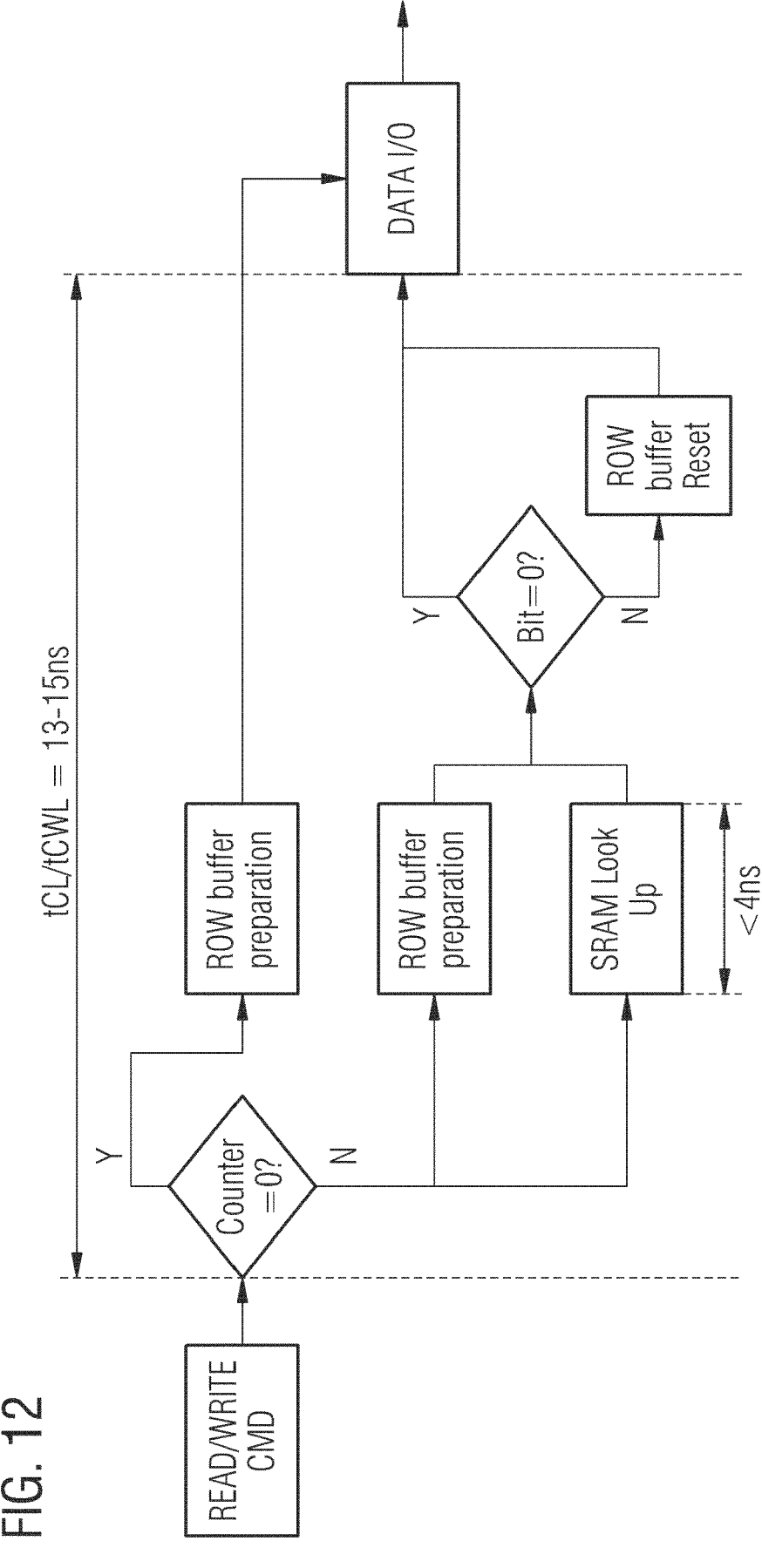
FIG. 12 shows a flow diagram of a row buffer reset during read/write.

FIG. 12 shows a flow diagram of a row buffer reset during read and/or write of a DRAM. For example, FIG. 12 shows more details of the operations between the start of the preparation for the read or write and the data input or output I/O. The row buffer may be prepared for a normal read or write operation, if the counter of the SRAM is 0. Otherwise, the row buffer preparation is done in parallel to an SRAM look up (e.g. SRAM is checked whether the row for read or write is indicated for erasure). If the bit of the SRAM for the row of the read or write request is set, then the row buffer is reset. Otherwise, the read or write operation is carried out as normal (without reset of the row buffer).

FIG. 12 may show a combined erase with subsequent ROW access. For an OOB Resettable DRAM, the resetting may be asynchronous. A window may occur between a resetting request is placed and the content actually got reset.

For each READ and/or WRITE request, per command received, the DRAM may look up SRAM bits (in the auxiliary memory) in parallel. The look up and update may be performed as an SRAM read which may take <4 ns. On bit set, the DRAM may reset the ROW buffer subsequently. The whole process may be fully hidden in the DRAM latency between READ and/or WRITE commands and actual data input-output IO, which could be 13-15 ns. On bit unset, the proposed process might not be executed.

More details, optional features and aspects are mentioned in connection with one or more examples described above or below.

Some examples relate to a memory device comprising an input interface configured to receive an erase request indicating a memory portion to be erased and control circuitry configured to trigger erasing information stored by memory cells of at least a part of the indicated memory portion of the memory device by writing a predefined pattern into the memory cells during an automatic refresh cycle. Further, the input interface is configured to receive a read or write request for a row of memory cells and the control circuitry is configured to trigger a reset of row buffers of a memory array comprising the row of memory cells indicated by the read or write request based on a predefined pattern during a read or write cycle assigned for the received read or write request and before outputting of information stored by one or more memory cells indicated by the read or write request or before inputting information to be stored by one or more memory cells indicated by the read or write request, if an erase request was received for the row of memory cells indicated by the read or write request.

The memory device may be able to erase the information stored by memory cells during an automatic refresh cycle or a read or write cycle. For example, a row of memory cells may be indicated for erasure (e.g. by a set bit of an auxiliary memory) and the control circuit may trigger the reset of these memory cells based on an automatic refresh of the row of memory cells or a read or write request for the row of memory cells, whichever occurs earlier.

For example, the erase operation may be triggered by a subsequent read and/or write request, a synchronous command of a memory controller to erase with a predefined pattern, a DRAM auto-refresh and/or a storage media (e.g. persistent memory or NAND storage) background operation. For example, a reset or erasure may be triggered by a received erase request (e.g. with pattern) by an interface of the DRAM, by receiving the request to reset the row buffer using that pattern immediately, by the DRAM auto refresh and/or a persistent memory device or NAND storage device to erase a row during a background cleanup operation (e.g. garbage collection or write leveling).

For example, instead of one or more rows, 1/Nth of a row may be marked in the SRAM for erasure and 1/Nth of the row buffer may be reset triggered by one of the examples above except for the DRAM auto refresh.

If the reset is triggered by the DRAM auto refresh and/or a storage media background operation), there may be a window between erase request placed and actual done, since the erasure might not be merged with a subsequent read and/or write.

The OS may have the capability to make sure that an erased page might only be allocated for new usage after confirmation of the asynchronous erase completion (e.g. by querying the SRAM status or by recycling the page after an auto refresh cycle, e.g. 64 ms).

More details, optional features and aspects are mentioned in connection with one or more examples described above or below.

Figure 13:
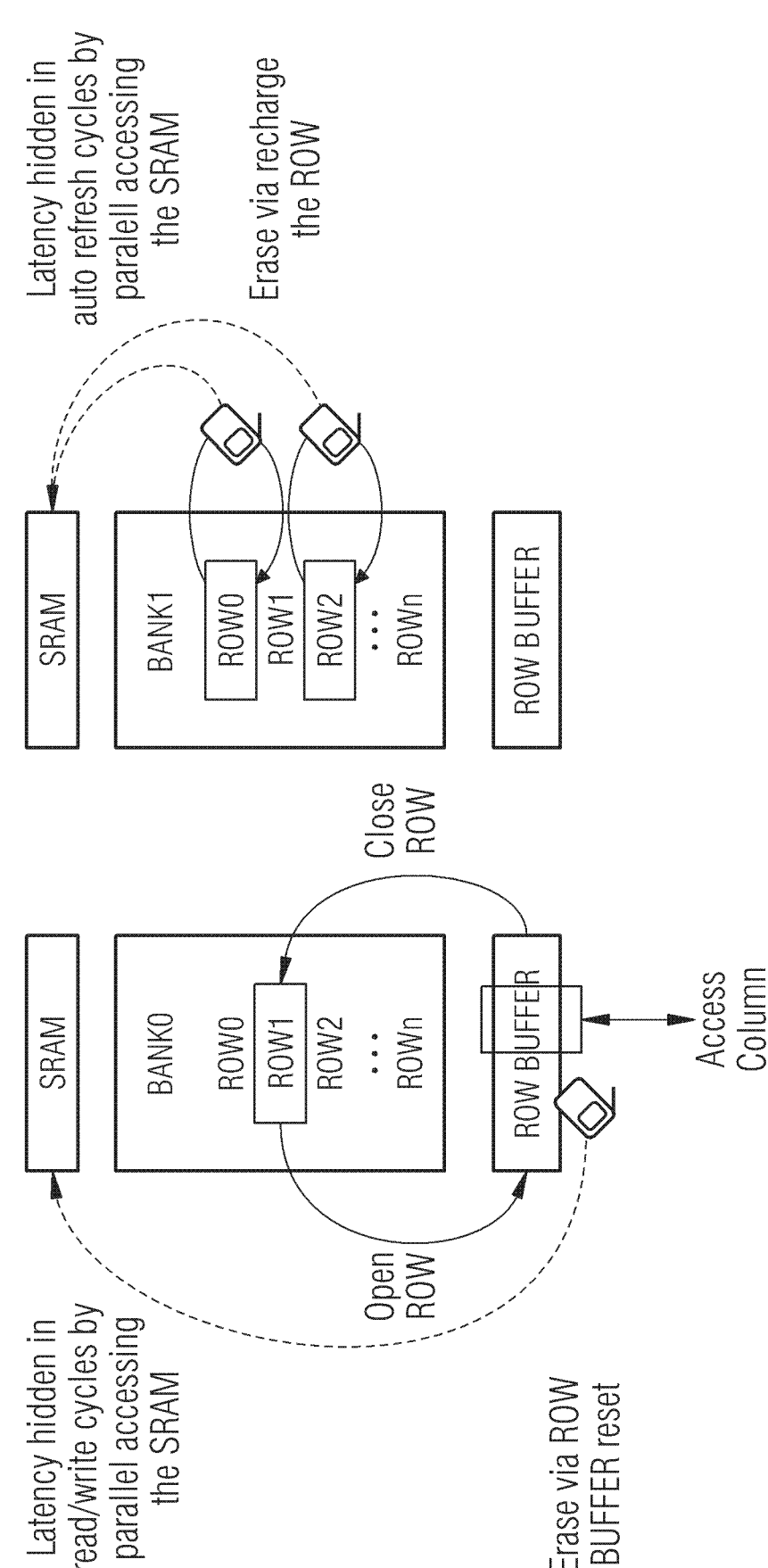
FIG. 13 shows a schematic illustration of a row buffer reset during read/write and erasing rows during auto refresh.

FIG. 13 shows a schematic illustration of a row buffer reset during read or write and erasing rows during auto refresh. The latency of the SRAM access for an erasure via a row buffer reset during a read or write operation may be hidden in read/write cycles. The latency of the SRAM access for an erasure via recharging of a row during auto refresh may be hidden in the auto refresh cycle. Multiple rows may be refreshed in a batch.

More details, optional features and aspects are mentioned in connection with one or more examples described above or below.

Figure 14:
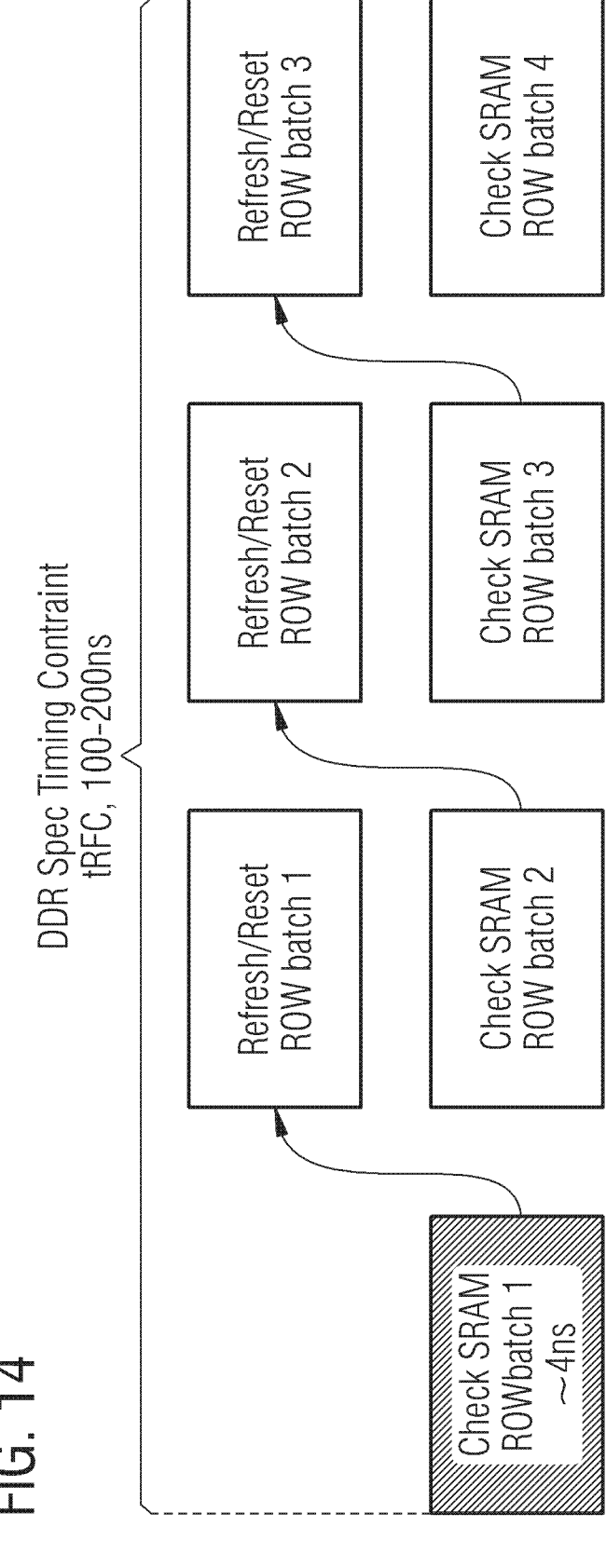
FIG. 14 shows a schematic timing of a pipeline of a sequence of row buffer resets during auto refresh.

FIG. 14 shows a schematic timing of a pipeline of a sequence of row erasing during auto refresh. A sequence of read or write requests may be processed in a pipelined way. The SRAM may be checked for row batch 1 (e.g. within ~4 ns). Then, the refresh or reset of row batch 1 may be performed and the SRAM may be checked for row batch 2 in parallel. Subsequently, the refresh or reset of row batch 2 may be performed and the SRAM may be checked for row batch 3 in parallel. Then, the refresh or reset of row batch 3 may be performed and the SRAM may be checked for row batch 4 in parallel.

For example, the DRAM ROW refresh may be batched (e.g. each refresh may cover 4-16 ROW in parallel). The SRAM bit query and reset may be also batched. The SRAM may satisfy the condition that {STACK, BANK GROUP, BANK, ROW} addresses of the refreshed ROW batch is mapped to the adjacent bits of the SRAM cells, which could be accessed in form of a single SRAM word.

With such an implementation, each ROW batch refresh may only need one SRAM read-update-write cycle (e.g. <4 ns). The ROW batch refresh and the SRAM batch query could be executed in parallel and in a pipelined manner. For example, refresh and/or reset of ROW batch #n and SRAM query for ROW batch #n+1 may be executed simultaneously (e.g. FIG. 14). With the query result of ROW batch #n+1 from the previous round, the DRAM microcontroller could execute the next round of operation (e.g. refresh and/or reset ROW batch #n+1 and SRAM query for ROW batch #n+2).

The extra cost may tiny, which may be only 1 SRAM read plus write (e.g. <4 ns) and could be fully hidden in the refresh execution latency (e.g. 100-300 ns), which may be a DDR specific timing constraint tRFC. When the counter=0, no performance overhead may occur at all.

More details, optional features and aspects are mentioned in connection with one or more examples described above or below.

Figure 15:
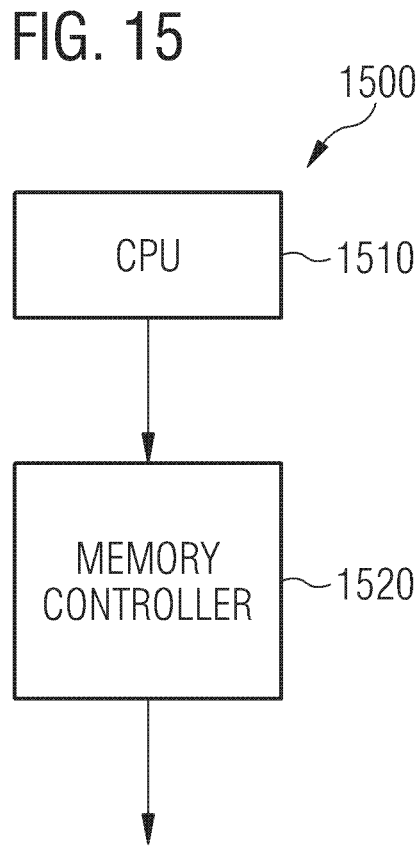
FIG. 15 shows a schematic illustration of a computing system.

FIG. 15 shows a schematic illustration of a computing system 1500. The computing system 1500 comprises one or more CPUs 1510 configured to run an operating system generating an operating system erase request indicating a high level memory address to be erased. Further, the computing system 1500 comprises one or more memory controllers 1520 configured to determine a memory block of a DIMM based on the operating system erase request and generate a memory controller erase request indicating the memory block to be erased during an automatic refresh cycle or read/write cycle of the DIMM.

By using the time of the automatic refresh cycle to erase memory cells, the access time for normal read or write requests may be increased. The memory device may be significantly less blocked by erase tasks. No or less performance overhead may occur, neither in form of bandwidth loss, nor jitters. If the memory erasing is carried out along with auto-refresh, no or less impact may be caused to in-band access cycles (e.g. normal read or write requests) of a system bus, a memory controller and/to a DRAM.

The memory controller erase request may comprise memory stack information, memory bank group information, memory bank information and/or memory row information for at least a part of the memory block to be erased. The memory controller erase request may comprise information on a predefined pattern to be used for erasing the memory block by writing the predefined pattern into memory cells of the memory block to be erased.

The high level memory address may be a physical memory address visible for the operating system. The high level memory address may be mapped to one or more rank address blocks by the one or more memory controllers 1520.

The computing system 1500 may be configured to determine during boot time that at least one memory module is capable of erasing memory cells during automatic refresh.

For example, the BIOS may determine whether at least one memory module is capable of erasing memory cells during automatic refresh.

The operating system may generate the operating system erase request after closing an executed service, for example, if the high level memory address was assigned to the service.

The operating system erase request may relate to several memory blocks controlled by several memory controllers. For example, the one or more memory controllers may comprise a first memory controller and a second memory controller. The first memory controller may be configured to determine a first memory block of a first DIMM based on the operating system erase request and generate a first memory controller erase request indicating the first memory block to be erased during an automatic refresh cycle of the first DIMM. The second memory controller may be configured to determine a second memory block of a second DIMM based on the operating system erase request and generate a second memory controller erase request indicating the second memory block to be erased during an automatic refresh cycle of the second DIMM.

More details, optional features and aspects are mentioned in connection with one or more examples described above or below.

Figure 16:
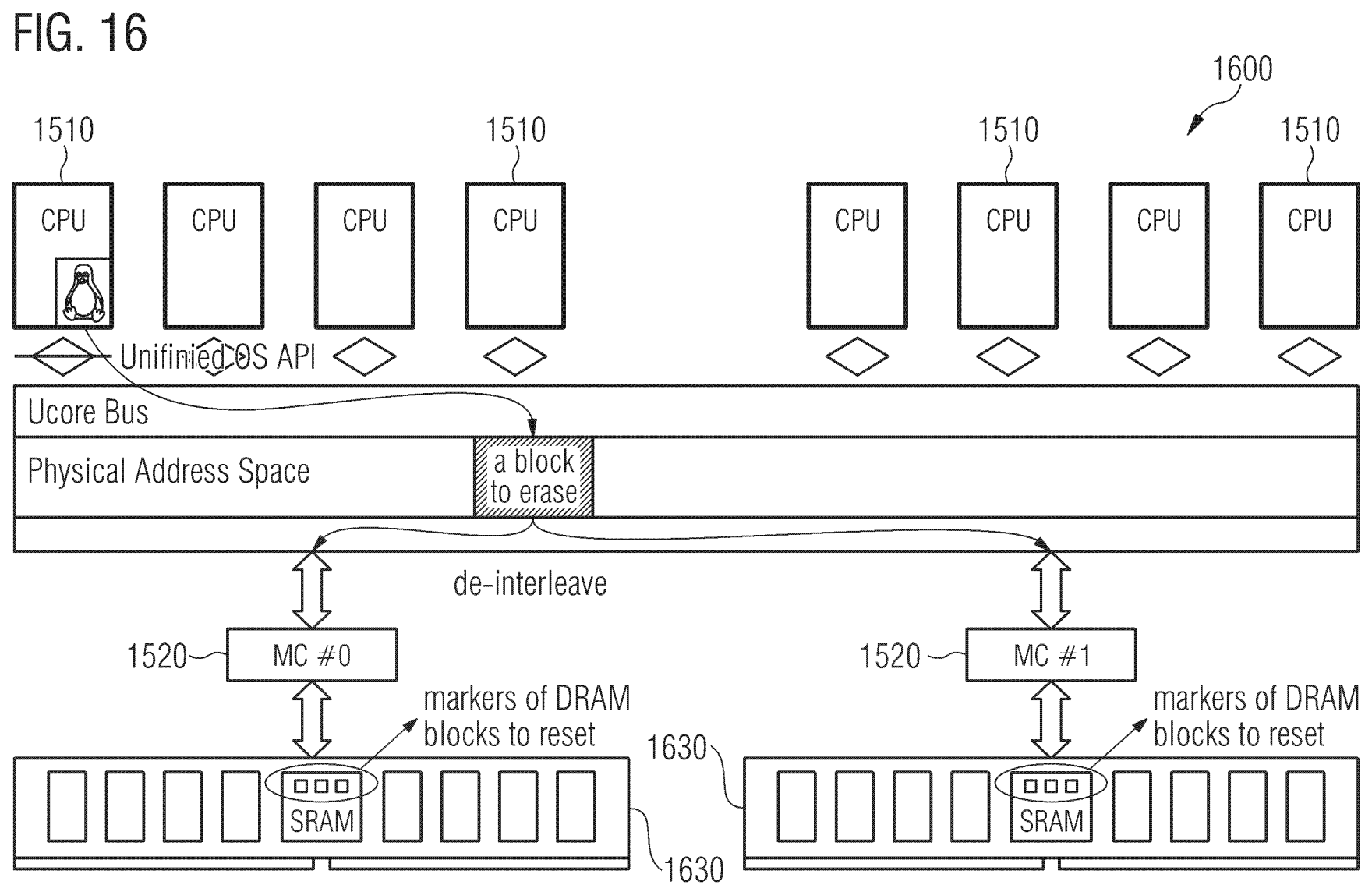

FIG. 16 shows a schematic illustration of a computing system 1600. The computing system 1600 may be implemented similar to the computing system described in connection with FIG. 15 and/or a DIMM 1630 of the computing system 1600 may be implemented similar to one of the examples described above. The computing system 1600 comprises a plurality of CPUs connected to a system bus. A CPU may issue an erase request for a memory block in the physical address space through a unified OS API. The memory block may be de-interleaved for further processing by a plurality of memory controllers 1520 (e.g. MC #1 and MC #2). Each memory controller 1520 may be connected to one or more DRAM DIMMs 1630 comprising an SRAM for marking DRAM blocks to be reset.

FIG. 16 may show a system architecture of a proposed computing system. FIG. 16 may show an OS Unified API for Memory Erasing Acceleration.

More details, optional features and aspects are mentioned in connection with one or more examples described above or below.

Figure 17:
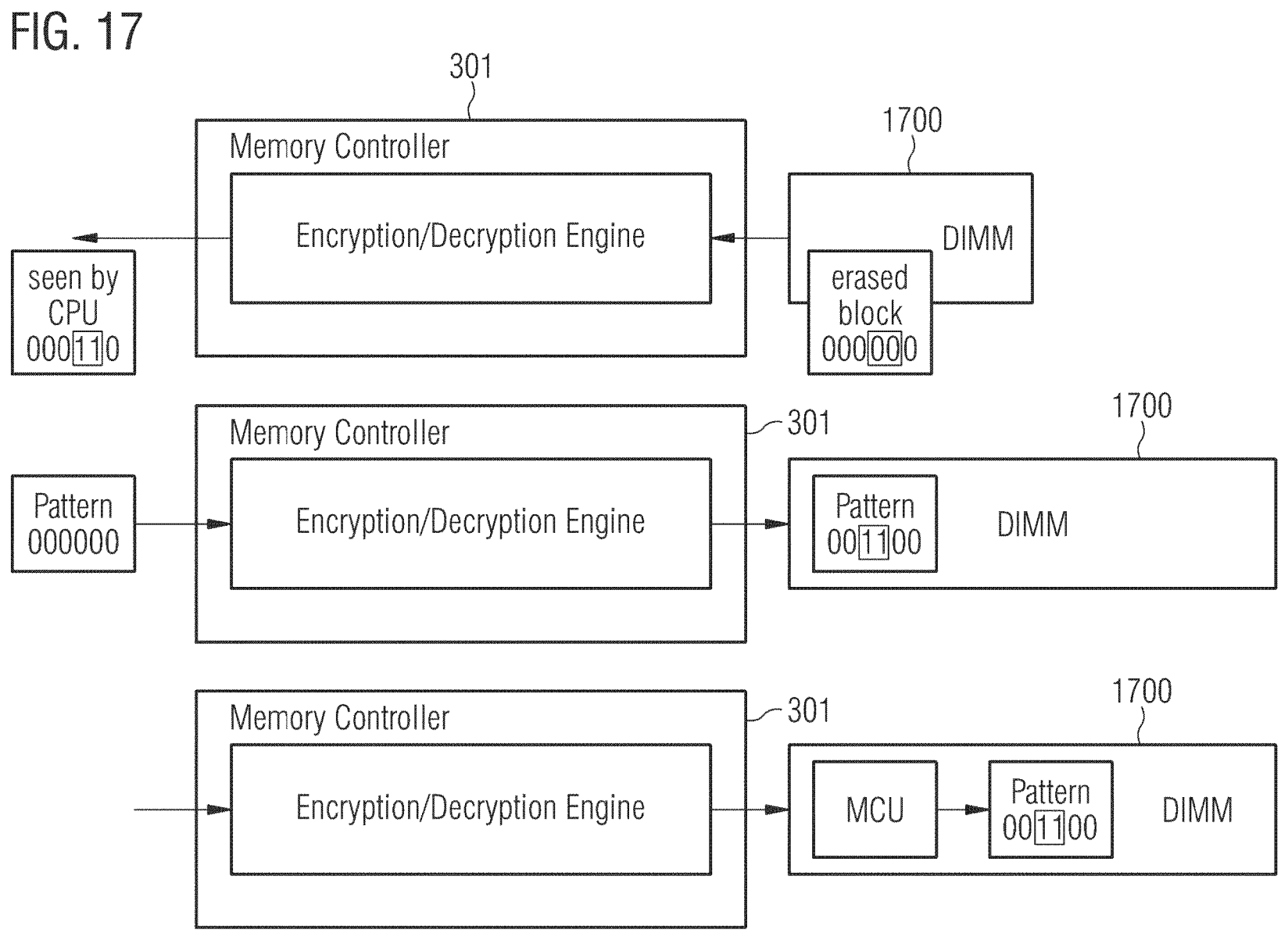

FIG. 17 shows a schematic illustration of data transformation. For some configurations, data may be transformed at the memory controller 301 for the sake of security (e.g. encrypted) and robustness. The erasing pattern may be distorted when data is read by the CPU or the IO agent. Nevertheless, data may be erased based on the proposed concept. The DIMM 1700 may be implemented similar to the memory device described in connection with FIG. 1, 2, 3, 6, 7, 8 or 10.

For example, the memory controller may provide a pattern, which may be transformed by the security engine of the memory controller or the DRAM microcontroller (e.g. the microcontroller unit) may help to generate a pattern and use this pattern to erase the DRAM ROW. In this way, not only erasing may be achieved, but also zeroing, when data transformation exists in between. The capability of zeroing may be important, since the OS may apply zeroing for variable initializations.

The memory controller and DRAM module (e.g. as described by FIG. 10) may:

a. Upon receiving the OS<->memory controller command, the memory controller may generate an Erase_Pattern encrypted from an All_Zero_Pattern and use below command to instruct DRAM module:

Action: ERASE BLOCK WITH*INPUT*PATTERN, parameter: {Erase_Pattern}, {STACK, BANKGROUP, BANK, ROW} b. Upon receiving this command, the DRAM may open that ROW and reset the ROW buffer using the given pattern. This might not be through SRAM bit set and might be a moderate cost, but it may satisfy the extra needs for zeroing a page when the transformation engine is on.

In some examples, the memory controller could also request the DRAM microcontroller to generate a pattern without inputting patterns every time (e.g. based on a pre-negotiated configuration between the memory controller and the DRAM at the memory initialization phase). The DRAM may be implemented as described in connection with FIG. 1, 2, 3, 6, 7, 8 or 10.

For example, a. The Memory controller passes a pre-negotiated configuration to the DRAM microcontroller at the BIOS memory initialization phase (e.g. via DRAM mode register setting).

b. Upon receiving an erasing command, the DRAM may mark the SRAM bit.

c. In a subsequent auto-refresh cycle or ROW access, the DRAM microcontroller generates the predefined pattern using the pre-negotiated configuration and erases the ROW.

For example, the pattern may be calculated by the DRAM circuit based on the row address and a seed in order to transform a 0 pattern to non-0 pattern, since only zero values in memory cells might not be good for power and signal integrity. An anti-conversion circuit at the memory controller may restore the pattern to zeros during the signal read out. For example, the CPU may write a 0 pattern and the memory controller may transform the 0 pattern to a non-0 encrypted pattern and write this pattern to the DRAM device. The memory controller security engine may restore it back to a 0 pattern during read out.

More details, optional features and aspects are mentioned in connection with one or more examples described above or below.

Figure 18:
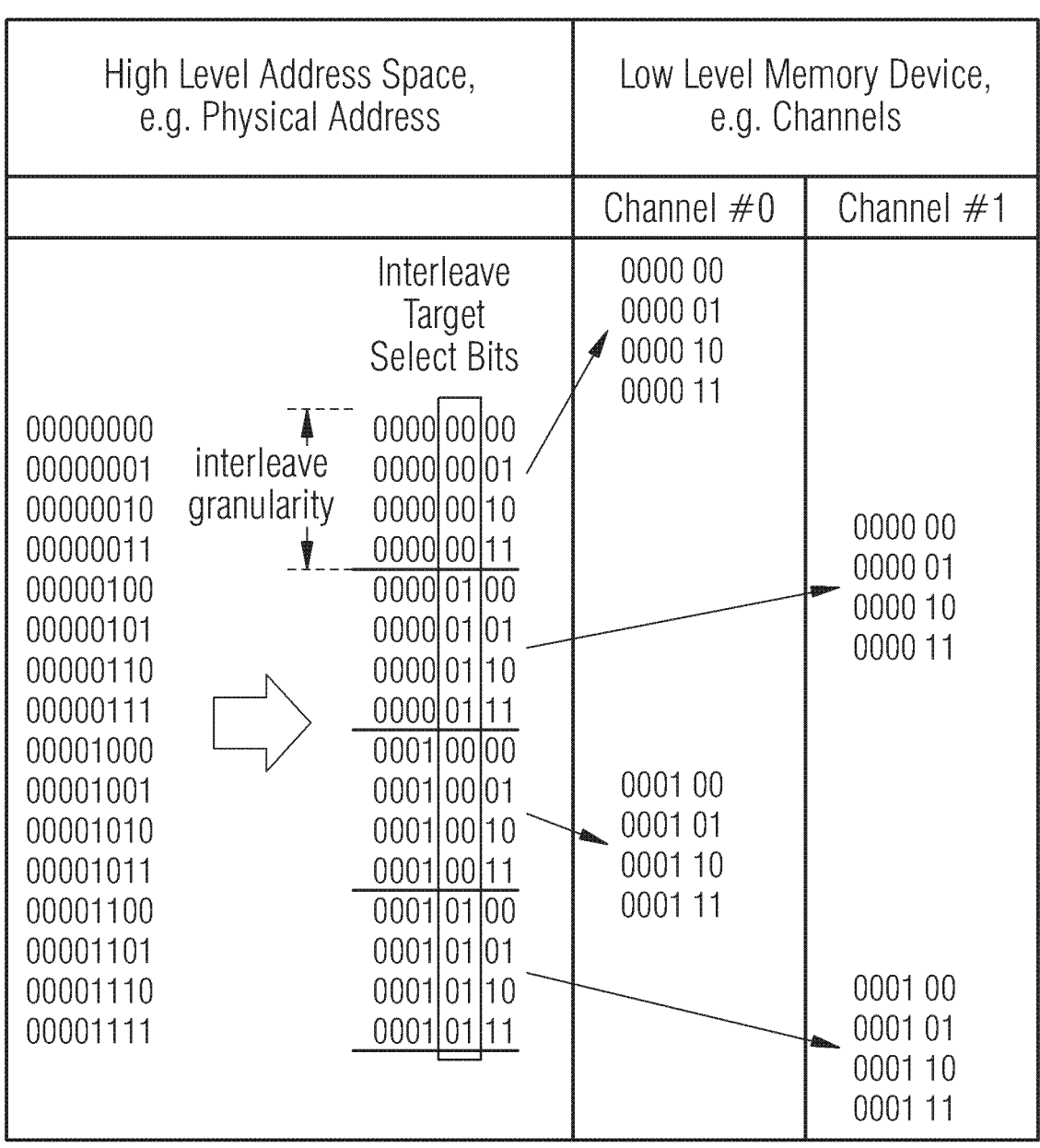
FIG. 18 shows an example for memory interleaving.

FIG. 18 shows an example for memory interleaving. Address interleaving and forming of a S_pab block may be shown. Memory interleaving is a way how multiple low-level memory devices form a unified high-level memory address space. By memory interleaving, the memory accesses on high-level memory address space may be spread to multiple low-level memory devices (e.g. to hide latency, scale bandwidth, and/or load balance).

FIG. 18 shows an example with the first 4 lines (e.g. each line may be 32B) coming from Channel #0 and the second 4 lines coming from Channel #1, and repeatedly so on. Accordingly, the interleave granularity is defined as 4 lines (e.g. 32×4=128B) in this example.

For example, the PHYSICAL address, which the OS sees is not equal to the RANK address, where the resetting operations are executed on the OOB Resettable DRAM. The OS visible PHYSICAL address space may be interleaved by multiple CHANNELs, each CHANNEL being interleaved by 2 SUB-CHANNELS, and each SUB-CHANNEL being interleaved by multiple RANKs from one or several DIMMs (e.g. FIG. 20).

Similarly, a resettable OS physical block (e.g. resettable PHYSICAL Address Block S_pab) may be composed of an integral multiple of S_rab (e.g. FIG. 20):

For example, S_pab=S_rab×N_dimm×N_rank×N_sub-channel×N_channel=2S_rab×N_dimm×N_rank× N_channel When S_rab is within the RANK interleave granularity (e.g. FIG. 21):

For example, S_pab=S_rab×N_sub-channel× N_channel=2S_rab×N_channel

The RANK interleave configuration of the memory controller may be implemented in a way to fit this relation.

S_pab may be determined by the DIMM population and the interleave setting (e.g. number of channel, ranks, dimms, and their interleave granularity). The rank interleave granularity may be important and a smaller S_pab scaling then mentioned above may be achievable. The rank interleave granularity may be a memory controller configuration item.

S_pab may dependent not only on the DIMM type (e.g. S_rab), but may depend also on the DIMM interleave configuration of the BIOS (e.g. N_dimm, N_rank, N_channel). All information needed to decide on S_pab may be collected by the BIOS at boot time and may be report to the OS (e.g. by mechanism like ACPI Heterogeneous Memory Attribute Table HMAT with certain extensions).

For example, an S_pab block may be composed by a set of identical S_rab blocks per each composing RANK (e.g. all with the same identification, for example, RA Block Selector as illustrated in FIGS. 4a and 4b). For example, for an S_pab block with PHYSICAL Address (PA), if the RA of the 1st composing S_rab block can be calculated from this PA, the corresponding RA Block Selector may be obtainable and the RA Block Selector may be used to erase all composing S_rab blocks. In such a way, the whole S_pab block may be erased.

For example, the calculation from PA to RA is named as address de-interleaving. This may be the hardware routing procedure how a CPU issued PA travels through CHANNEL, SUB-CHANNEL, DIMM and eventually arrives the target RANK.

The BIOS Memory Reliability and Stability (RAS) code may fulfill such calculation to help locating a broken RANK from a Machine Check Exception (MCE) reported on a broken PA. The utility could be exposed as ACPI Device Specific Method (DSM) to be invoked by the OS.

Alternatively, a system bus and memory controller hardware may be enhanced to allow the CPU to issue a dry-run PA access. Upon the arrival of the access at the memory controller, the {RANK ID, RA value} may be returned to CPU instead of returning the data at RA. This procedure may be invoked by an OS driver.

More details, optional features and aspects are mentioned in connection with one or more examples described above or below.

Figure 19:
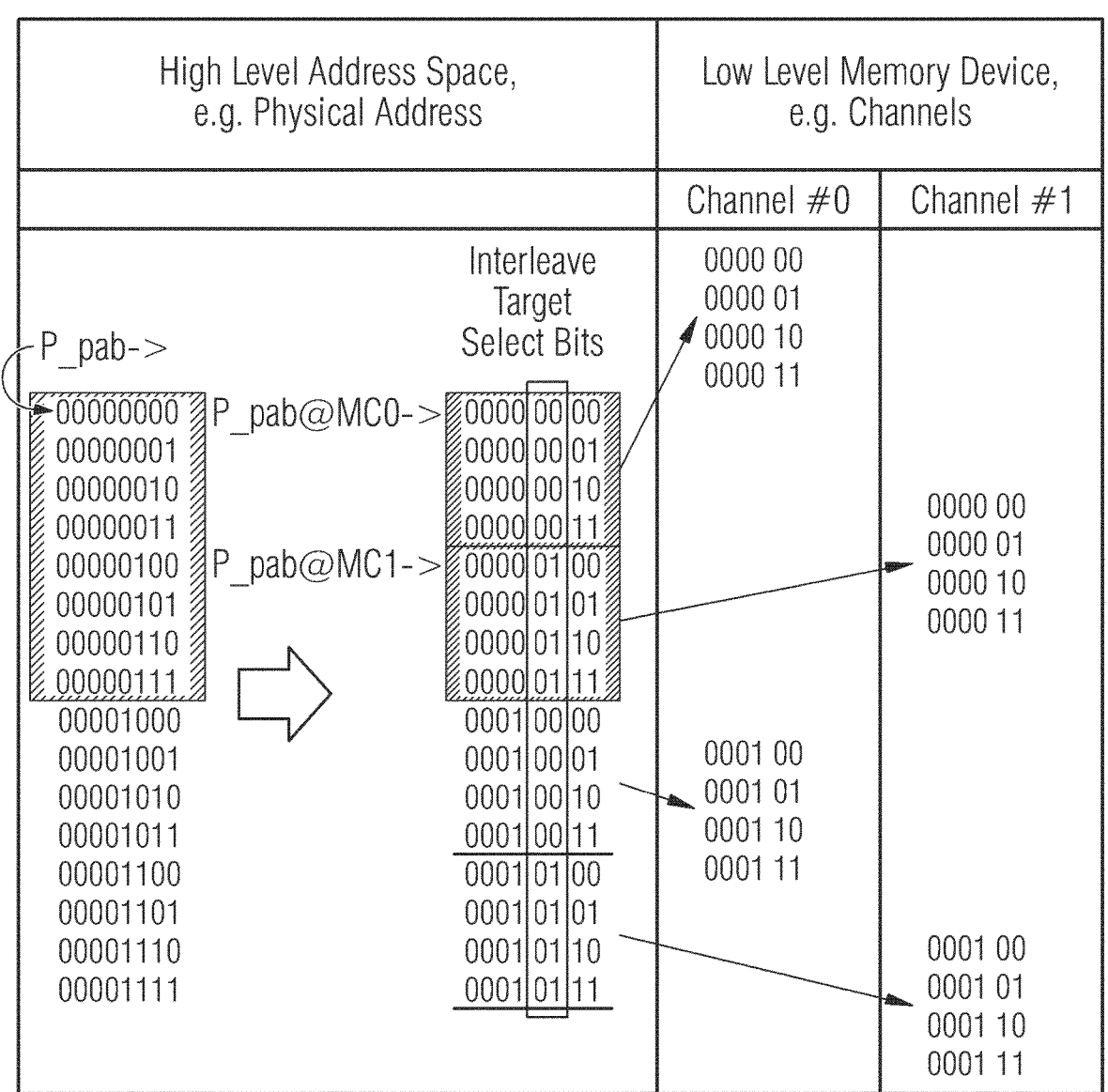
FIG. 19 shows an example for memory interleaving corresponding to FIG. 18.

FIG. 19 shows another example for memory interleaving. An erase for interleaved multiple memory controllers may be shown.

For single memory controller cases (e.g. 1 way interleave), the OS may issue a command {ERASE, P_pab} to that memory controller to execute the OOB erase (e.g. P_pab is the starting physical address of the S_pab block). When there are multiple memory controllers interleaving their address together, the command sequence may be expanded to:

{ERASE, P_pab@MC0}=>MC0
{ERASE, P_pab@MC1}=>MC1
. . .
{ERASE, P_pab@MCn}=>MCn

In FIG. 19, P_pab is the starting Physical Address (PA) of the OS erasable block. P_pab@MCn is the lowest address inside that OS erasable block, which is routed to MCn. Since memory controllers may build the PA to Channel Address (CA) and Rank Address (RA) by removing bits, and the outcome of bit removing of P_pab@MC0 . . . n may be all the same, the P_pab@MC0 . . . n may be replaced by using P_pab:

(ERASE, P_pab=>MC0
(ERASE, P_pab=>MC1
. . .
(ERASE, P_pab=>MCn

Figures 2, 20:
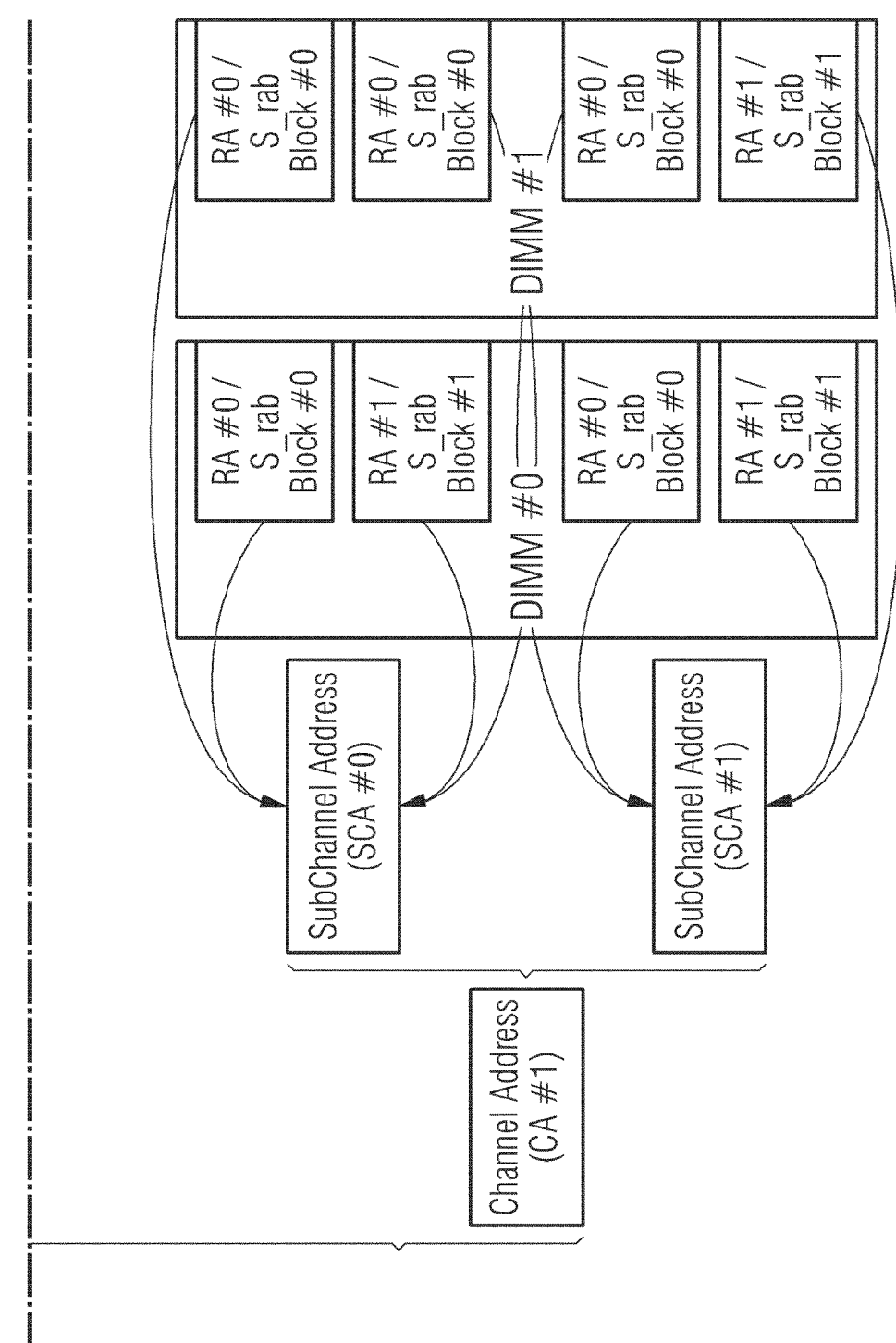
FIG. 20 shows an example for address interleaving and forming of an S_pab block.
Figures 2, 21:
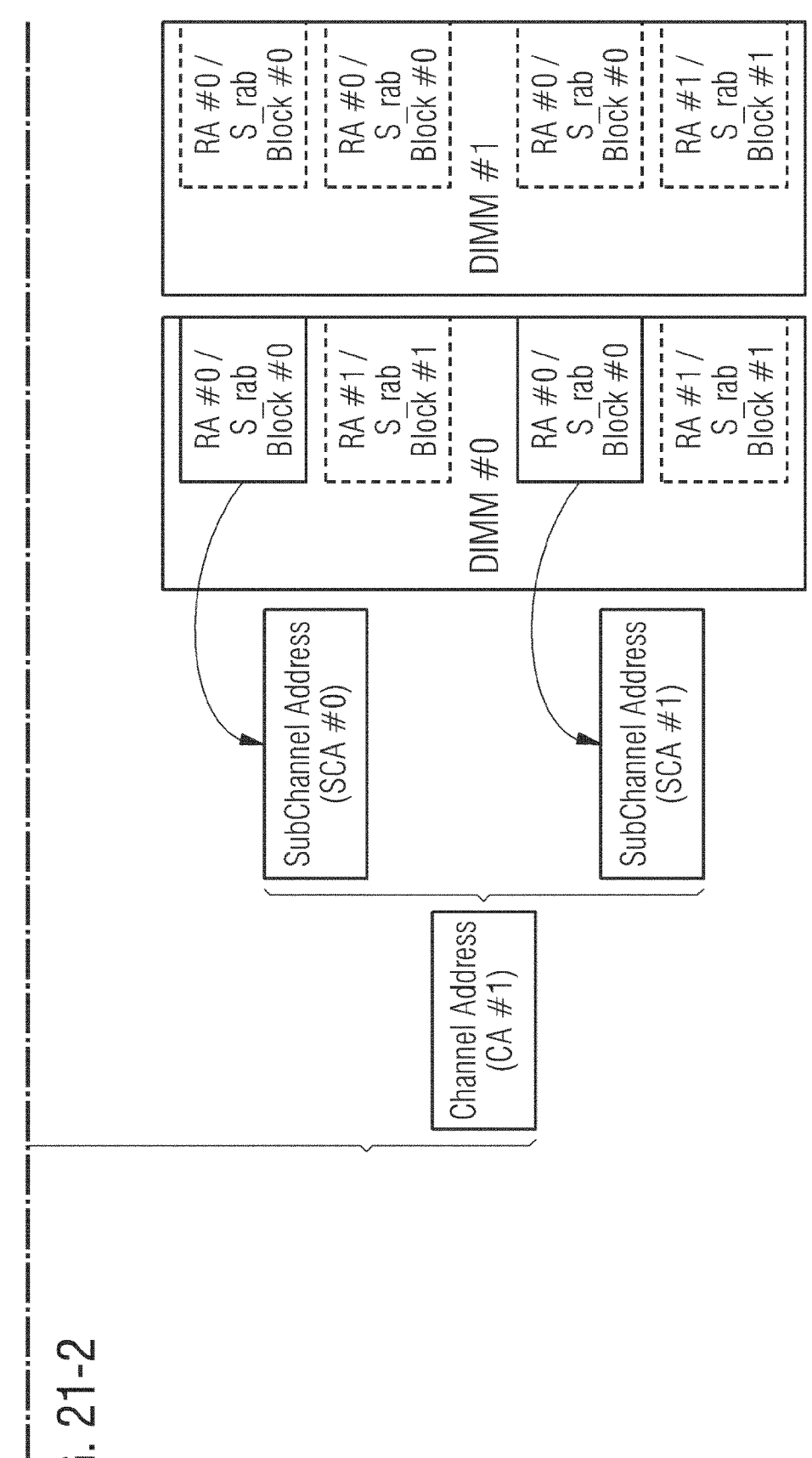
FIG. 21 shows another example for address interleaving and forming of a physical address block.

FIG. 20 shows an example for address interleaving and forming of an S_pab block and FIG. 21 shows another example for address interleaving and forming of a physical address block.

More details, optional features and aspects are mentioned in connection with one or more examples described above or below.

Figure 22:
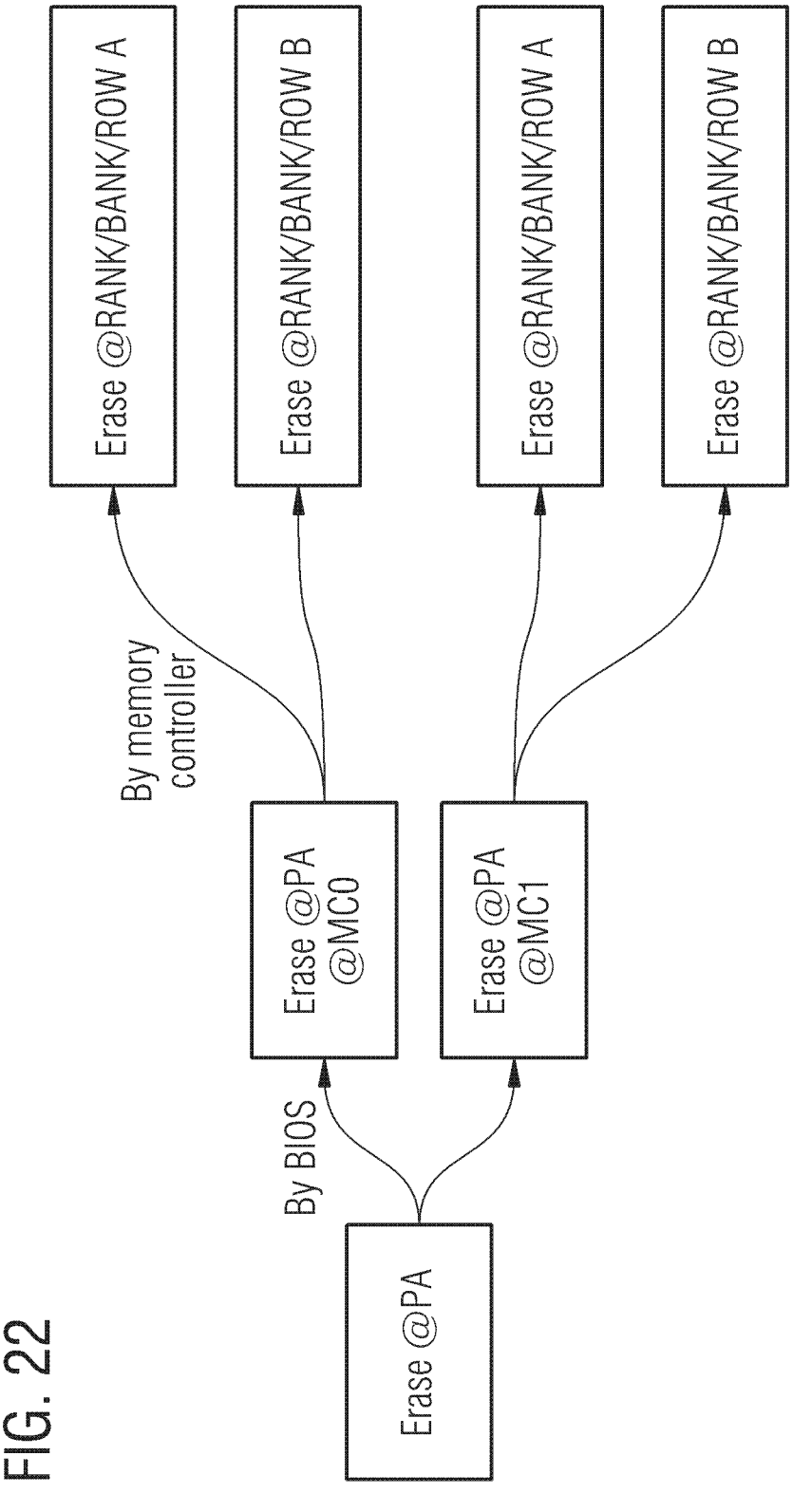
FIG. 22 shows an example of erase requests by several memory controllers.

FIG. 22 shows an example of erase requests by several memory controllers. The erase request may be handled as described in connection with FIG. 19. The BIOS may provide the information how an erase request for a physical address PA may be divided into erase request of separate memory controllers MC (e.g. MC0 and MC1) The memory controllers may divide the erase requests into rank, bank and/or row specific erase requests (e.g. see FIG. 19).

More details, optional features and aspects are mentioned in connection with one or more examples described above or below.

Figure 23:
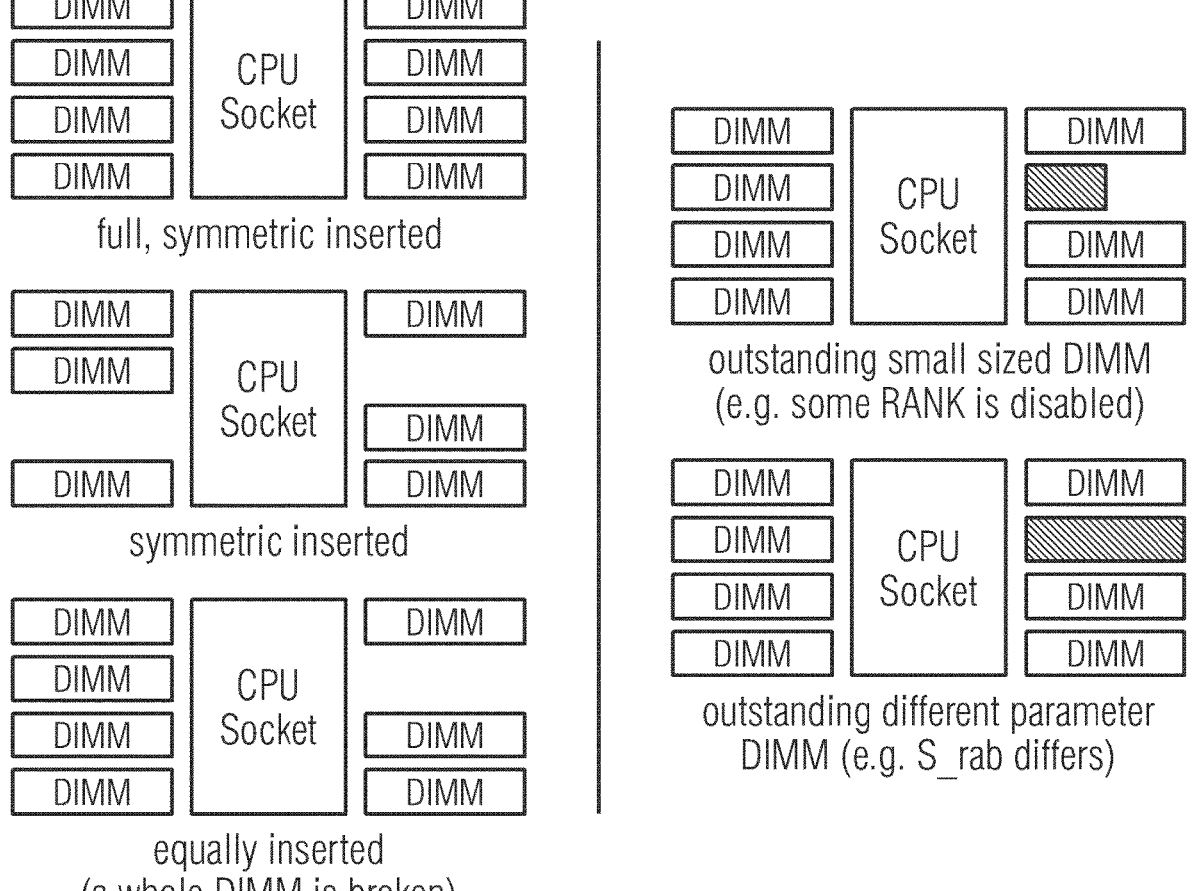
FIG. 23 shows examples for memory configurations.

FIG. 23 shows examples for memory configurations. The proposed concept may be used in cases, where memory channels are plugged with identical DIMMs, which may cover large majority of server configurations. For example, the DIMMs may be full symmetric inserted, symmetric inserted or equally inserted (e.g. if a whole DIMM is broken).

The proposed concept may be less suitable for server configurations with some channels being plugged with unidentical DIMMs. For example, the DIMMs may comprise an outstanding small sited DIMM (e.g. some RANK is disabled) or an outstanding different parameter DIMM (e.g. S_rab differs). These cases might be unusual during normal server usage, but may occur if some RANKs are broken and may be disabled by the BIOS temporarily before a replacement is carried out. The BIOS may detect such configurations and may disable the refresh resetting feature (e.g. using OOB Resettable DRAMs as normal DRAMs).

More details, optional features and aspects are mentioned in connection with one or more examples described above or below.

FIG. 24a-24e show examples of resettable mappable address blocks. S_pab blocks may be implemented with various sizes, which may be determined by platform configurations. These sizes might not always 100% fit into the size, which the OS uses for page management (e.g. mappable address block S_mab), which may be $2^n$ times 4 KB, 2 MB or 1 GB or another block size.

For example, when the OS is going to erase an S_mab block with size of $2^n$×4 KB, the OS might breakdown the S_mab block into a list of S_pab blocks plus up to 2 unaligned marginal blocks with size of S_uab[0] and S_uab[1] (e.g. S_uab blocks). S_pab blocks could be erased by DRAM refresh resetting, and S_uab blocks could be erased by the Data Streaming Accelerator DSA and/or the CPU.

FIG. 24 a-c show examples of S_mab->{S_pab, S_uab} mapping, when S_mab=32 KB and S_pab=24 KB, 32 KB or 64 KB.

In FIG. 24a S_mab=N×S_pab. 100% of S_mab can be erased OOB.

In FIG. 24b S_mab=N×S_pab+S_uab[0]+S_uab[1]. A portion of S_mab can be erased OOB (e.g. 75% in this example). When S_mab is bigger, the rate could be higher. For example, if S_mab=2 MB and S_pab=24 KB, the rate could be as high as 99.61%.

In FIG. 24c S_mab<S_pab. S_mab might be erased by CPU and/or DSA.

FIG. 24d-e show examples of S_mab->{S_pab, S_uab} mapping, when S_mab=128M and S_pab=32 MB or 48 MB.

For S_pab with a size of power-of-2, as long as S_mab>=S_pab, the portion that may benefit from the DRAM refresh resetting could be 100%. For S_pab with a size of an integer multiple of 3, the portion that may benefit from DRAM refresh resetting may depend on the value of S_mab.

More details, optional features and aspects are mentioned in connection with one or more examples described above or below.

Figure 25:
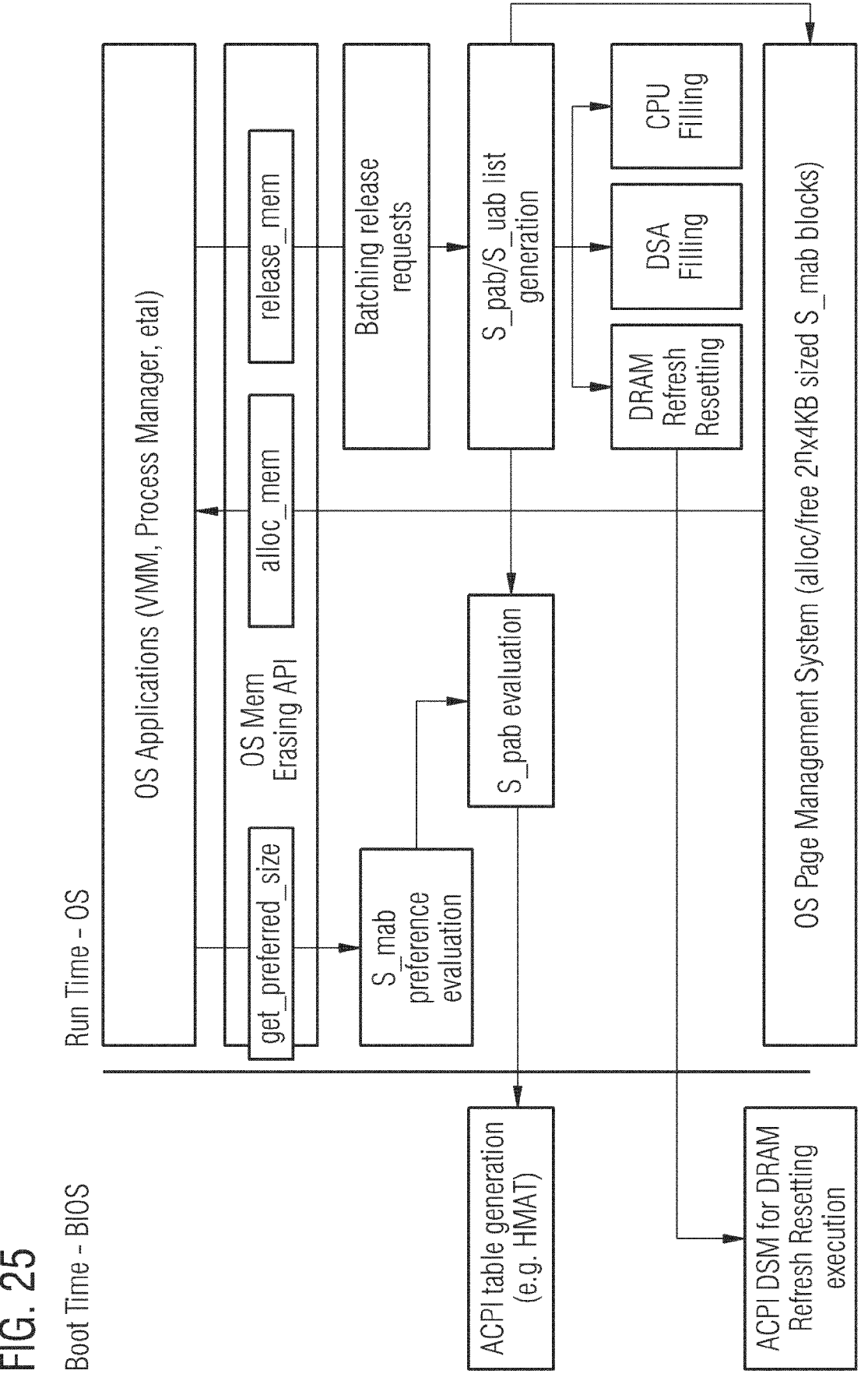
FIG. 25 shows a basic input/output system BIOS and operating system OS configuration.

FIG. 25 shows a basic input/output system BIOS and operating system OS stack. At boot time, the BIOS may gather the system configuration including a number of CHANNELs and RANKs, memory interleave parameters (e.g. ways and/or granularity) for CHANNELs and RANKs and the DRAM capabilities (e.g. if OOB resetting is supported). The BIOS may obtain information on the S_pab by or from an ACPI table generation (e.g. Heterogeneous Memory Attribute Table HMAT).

The BIOS may enable the DRAM capability per BIOS evaluation, if the system configuration supports OOB erasing. Otherwise, the BIOS may disable the DRAM capability and use them as normal DRAM.

The BIOS may provide the OS an API to program multiple memory controllers to erase S_pab blocks (e.g. through a ACPI Device Specific Method (DSM) or equivalent methods):

```
BIOS_Erase_Block (void* P_pab)
{
BIOS may determine the memory controllers composing this S_pab block
[MC0, MC1 ... MCn] and BIOS may issue commands to memory
controllers)
    {
{ERASE, P_pab} => MC0
{ERASE, P_pab} => MC1
{ERASE, P_pab} => MCn
    }
}
```

The BIOS may dynamically enable and/or disable the OOB erase feature for the DRAM at boot per evaluation of system configuration. The BIOS may present the capability to the OS to erase S_pab sized blocks, if there are multiple memory controllers interleaving.

The OOB erasing utilities may be implemented as part of the OS memory management system so that the complexity may be fully transparent to applications. The OS memory management system may be the central logic to serve applications (e.g. micro-services) to allocate and free various S_mab sized blocks. The OS page management system characteristic may be implemented so that S_mab may be merged to form bigger erase size. Each S_mab may be mapped to an OOB erase part and the CPU erased part and gets erased.

Depending on application requirements, the allocated S_mab blocks may have various sizes and may conform to the size condition of $2''×4$ KB. The OS memory management system may merge smaller S_mab to bigger ones, which may be easier OOB erasable.

The OS may run applications and may allocate and free memory blocks for the applications. For example, the OS page management system may receive information on the S_pab from the BIOS and may allocate and free memory blocks correspondingly (e.g. allocate/free $2''×4$ KB sized S_mab blocks). In the example of FIG. 25, the API may use the OS memory management code to allocate and free S_mab blocks. In this case, the S_mab size may be fully decided by the application and the demands of the OS and the value of S_mab might not be as big. The OS may map each S_mab block to be erased to S_pab and/or S_uab lists. The S_pab may be issued for OOB erase by the BIOS method (e.g. DRAM refresh resetting), for example, through ACPI DSM for DRAM refresh resetting execution. The S_uab may be issued for DSA and/or CPU pattern filling (e.g. as shown in FIG. 24a-e and/or 25). Additionally or alternatively, the OS may provide the S_mab for CPU and/or DSA cache line invalidation.

The OS may simultaneously invalidate the cache for S_mab blocks (e.g. using a corresponding instruction).

The S_mab block may be put back into the free list (e.g. freed S_mab pool) for future usage. More details, optional features and aspects are mentioned in connection with one or more examples described above or below.

Figure 26:
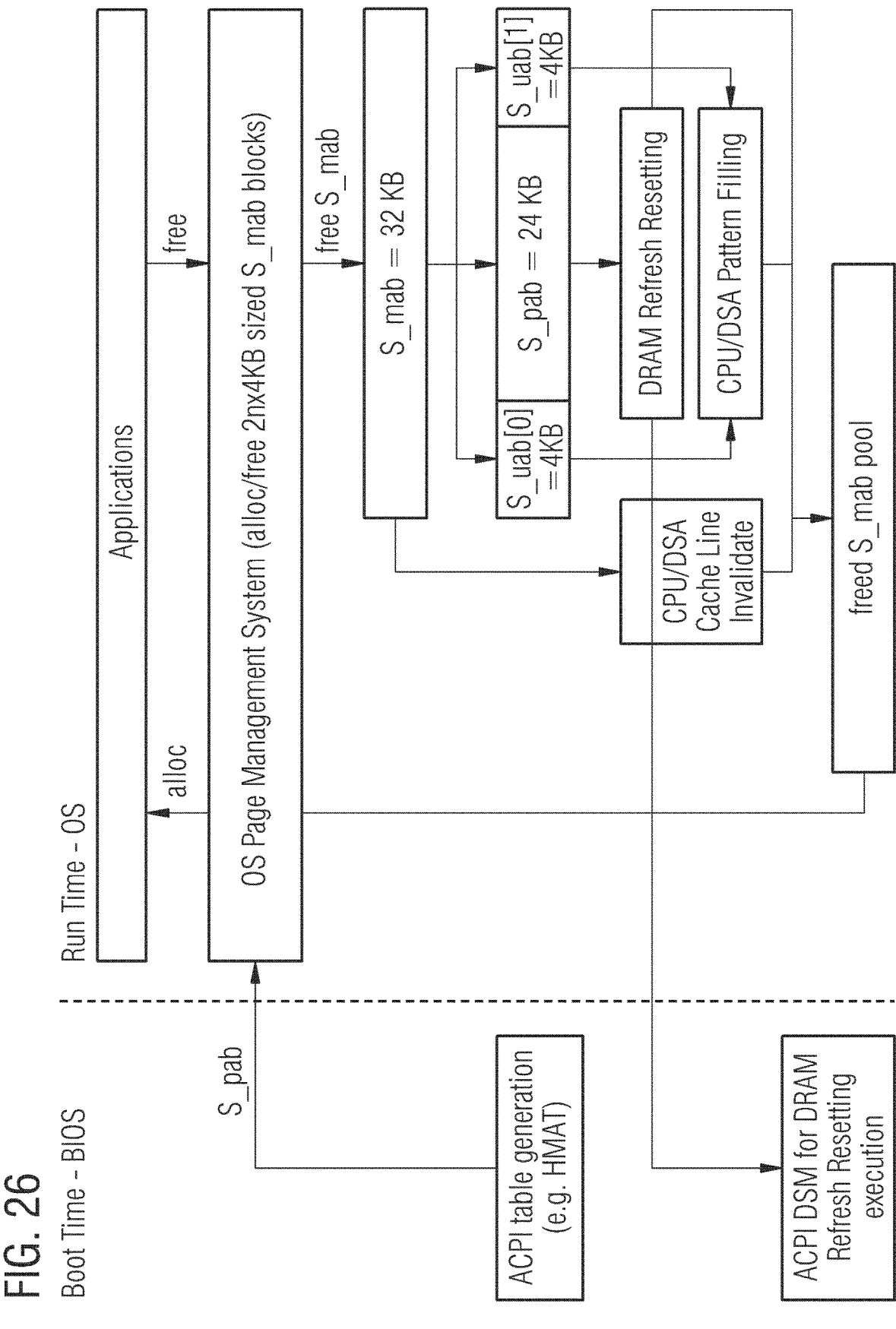
FIG. 26 shows another basic input/output system BIOS and operating system OS configuration.

FIG. 26 shows a basic input/output system BIOS and operating system OS stack architecture for unified OS API. The BIOS and OS stack may be implemented similar as described in connection with FIG. 25.

FIG. 26 may be an example with an extra API layer added on top of the OS page management system. For example, users can use this API to query a best fit S_mab block to be allocated and allocate with the preferred S_mab size accordingly. The API can gather many requests to batch releases (e.g. to utilize the through put advantage of auto-refresh based erase). This API may be more suitable for case where the value of S_mab is big.

The OS may run applications (e.g. virtual machine manager VMM, process manager or others) and may use an OS memory erasing API for allocating and releasing memory and/or getting preferred size information through an S_mab preference evaluation and an S_pab evaluation, for example, based on the ACPI table generation. The OS may trigger a memory release causing batched release requests (e.g. erase requests). The release request may cause an S_pab and S_uab list generation, which may be used for DRAM refresh, DSA filling and/or CPU filling. For example, after the S_pab and S_uab list is erased, the memory blocks are returned to the OS page management system, which is able to manage $2''×4$ KB sized S_mab blocks.

A unified OS API may be implemented to hide details from user programs (e.g. with only 3 interfaces as described in below table).

Users may invoke this API to obtain erased MAPPALE address blocks of any size, which may be maximally and/or optimally accelerated by one or multiple memory erasing acceleration techniques, in a transparent manner.

The S_mab block may be broken down into a list of S_pab and S_uab blocks. For S_uab blocks, DSA or CPU filling may be scheduled. For S_pab blocks, DSA based cache line invalidation may be scheduled. For S_pab blocks, DRAM refresh resetting may be scheduled and the CPU may poll for their completion using a software timer on pace of 0.5 DRAM refresh cycles (e.g. 64 ms/2=32 ms). The completion may be confirmed after 2-3 polling cycles.

The three mentioned paths may be schedule in parallel and the whole erase may be confirmed for completion after all three are done.

An example for possible commands is described in the following table:

| Name | Description | Notes |
|------|-------------|-------|
| void* alloc_mem (int mem_size) | Allocate an erased MAPPABLE memory block with mem_size. | mem_size is $2^n \times 2$ MB, n >= 1 <br><br> Return value is the OS PHYSICAL memory pointer |
| void release_mem (void* mem_pointer) | Release a MAPPABLE memory block previously allocated by the API. The memory block will be erased maximumly accelerated by DRAM refresh resetting, DSA and CPU, and return to OS page management system afterwards in an asynchronous way. | mem_pointer is the pointer to previous allocated MAPPABLE memory block. The API will buffer multiple memory erasing requests and execute them in a batch so that the performance scalability of acceleration techniques could be maximized. |
| int get_preferred_size (void) | The API will return a recommended S_mab value with >90% DRAM refresh resetting coverage ratio per actual DIMM/BIOS configuration. | OS could refer to the returned value to place S_mab allocation requests. |

More details, optional features and aspects are mentioned in connection with one or more examples described above or below.

FIG. 27 shows a schematic illustration of erasing a mappable address block (e.g. S_mab erase acceleration). An S_mab (e.g. with size of 8 MB) may be divided into one or more S_pab (e.g. with size of 48 MB) and one or more S_uab (e.g. with size of 16 MB). The S_pab blocks may be scheduled for DSA cache line invalidation and/or DRAM refresh resetting and the S_uab blocks may be scheduled for CPU and/or DSA filling. Completion may be reported to the OS. For smaller sizes S_mab requests, the API might use more CPU than DSA and/or DIMM refresh resetting to avoid the hardware start and/or stop overheads. The API may decide on the best acceleration configuration from performance point of view.

More details, optional features and aspects are mentioned in connection with one or more examples described above or below.

Some examples relate to Out-Of-Band OOB resettable DRAM Memory Architecture and Unified OS API for Memory Erasing Acceleration. An out-of-band memory erasing technique may be proposed, which does not take access cycles in the system bus, the memory controller and/or the DRAM. The DRAM microcontroller may have the capability to reset certain memory regions asynchronously in auto-refresh cycles. Both bandwidth loss and performance jitters may be avoided or reduced. In-band may mean access cycles in the system bus, the memory controller and/or the DRAM may be taken (due to memory erasure). Out-of-band may mean no access cycles in the system bus, the memory controller and/or the DRAM may be taken (due to memory erasure).

For example, a DRAM may be proposed with an interface for the OS to set the to-be-erased DRAM RANK address blocks and with a tiny SRAM to mark these blocks for asynchronous erasing. The DRAM microcontroller may reset all these blocks using auto refresh cycles or combine the erasing with subsequent DRAM ROW accesses (e.g. without costs with respect to read/write access). Examples for proposed DRAMs are described above or below (e.g. FIG. 1, 3, 7, 8 or 10).

Further, a unified operating system OS application programming interface API for memory erasing acceleration.

For OOB resettable DRAM, the API may map an OS visible PHYSICAL address block to a DRAM RANK address block and program the DRAM SRAM bit map to execute out-of-band erasing. The OS may issue erasing requests for many PHYSICAL address blocks in a batch manner with quite a big volume, and requests can be completed within one auto refresh cycle (e.g. 64 ms). Examples for proposed computing systems running a proposed OS are described above or below (e.g. FIG. 15 or 16).

More details, optional features and aspects are mentioned in connection with one or more examples described above or below.

Figure 28:
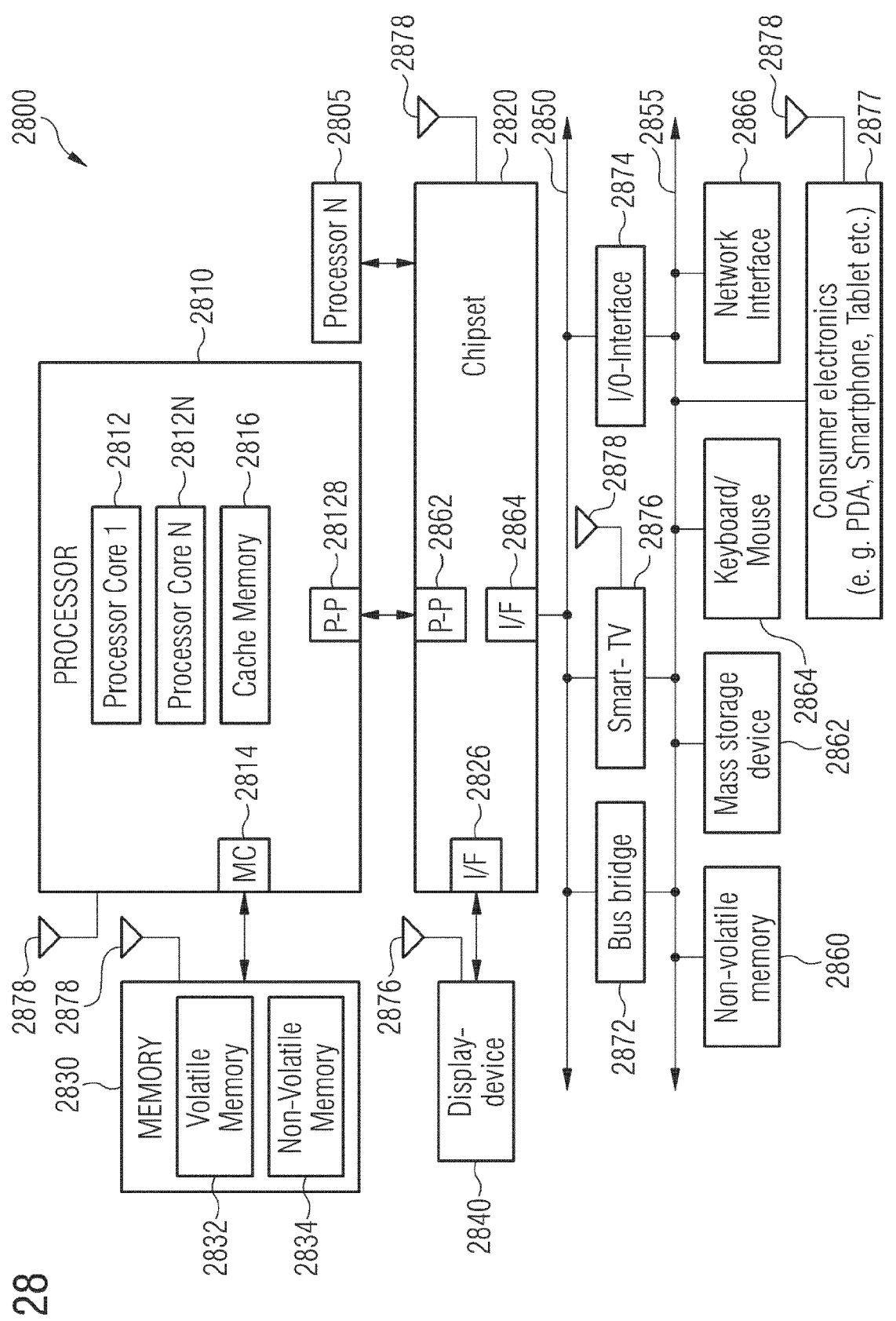
FIG. 28 shows a block diagram of a computing system.

FIG. 28 is included to show an example of a higher level device application for the disclosed examples. The MAA cantilevered heat pipe apparatus embodiments may be found in several parts of a computing system. In an embodiment, the MAA cantilevered heat pipe is part of a communications apparatus such as is affixed to a cellular communications tower. The MAA cantilevered heat pipe may also be referred to as an MAA apparatus. In an embodiment, a computing system 2800 includes, but is not limited to, a desktop computer. In an embodiment, a system 2800 includes, but is not limited to a laptop computer. In an embodiment, a system 2800 includes, but is not limited to a netbook. In an embodiment, a system 2800 includes, but is not limited to a tablet. In an embodiment, a system 2800 includes, but is not limited to a notebook computer. In an embodiment, a system 2800 includes, but is not limited to a personal digital assistant (PDA). In an embodiment, a system 2800 includes, but is not limited to a server. In an embodiment, a system 2800 includes, but is not limited to a workstation. In an embodiment, a system 2800 includes, but is not limited to a cellular telephone. In an embodiment, a system 2800 includes, but is not limited to a mobile computing device. In an embodiment, a system 2800 includes, but is not limited to a smart phone. In an embodiment, a system 2800 includes, but is not limited to an internet appliance. Other types of computing devices may be configured with the microelectronic device that includes MAA apparatus embodiments.

In an embodiment, the processor 2810 has one or more processing cores 2812 and 2812N, where 2812N represents the Nth processor core inside processor 2810 where N is a positive integer. In an embodiment, the electronic device system 2800 using a MAA apparatus embodiment that includes multiple processors including 2810 and 2805, where the processor 2805 has logic similar or identical to the logic of the processor 2810. In an embodiment, the processing core 2812 includes, but is not limited to, pre-fetch logic to fetch instructions, decode logic to decode the instructions, execution logic to execute instructions and the like. In an embodiment, the processor 2810 has a cache memory 2816 to cache at least one of instructions and data for the MAA apparatus in the system 2800. The cache memory 2816 may be organized into a hierarchal structure including one or more levels of cache memory.

In an embodiment, the processor 2810 includes a memory controller 2814, which is operable to perform functions that enable the processor 2810 to access and communicate with memory 2830 that includes at least one of a volatile memory 2832 and a non-volatile memory 2834. In an embodiment, the processor 2810 is coupled with memory 2830 and chipset 2820. The processor 2810 may also be coupled to a wireless antenna 2878 to communicate with any device configured to at least one of transmit and receive wireless signals. In an embodiment, the wireless antenna interface 2878 operates in accordance with, but is not limited to, the IEEE 802.11 standard and its related family, Home Plug AV (HPAV), Ultra Wide Band (UWB), Bluetooth, WiMax, or any form of wireless communication protocol.

In an embodiment, the volatile memory 2832 includes, but is not limited to, Synchronous Dynamic Random Access Memory (SDRAM), Dynamic Random Access Memory (DRAM), RAMBUS Dynamic Random Access Memory (RDRAM), and/or any other type of random access memory device. The non-volatile memory 2834 includes, but is not limited to, flash memory, phase change memory (PCM), read-only memory (ROM), electrically erasable programmable read-only memory (EEPROM), or any other type of non-volatile memory device. The memory 2830 stores information and instructions to be executed by the processor 2810. In an embodiment, the memory 2830 may also store temporary variables or other intermediate information while the processor 2810 is executing instructions. In the illustrated embodiment, the chipset 2820 connects with processor 2810 via Point-to-Point (PtP or P-P) interfaces 2817 and 2822. Either of these PtP embodiments may be achieved using a MAA apparatus embodiment as set forth in this disclosure. The chipset 2820 enables the processor 2810 to connect to other elements in the MAA apparatus embodiments in a system 2800. In an embodiment, interfaces 2817 and 2822 operate in accordance with a PtP communication protocol such as the Intel® QuickPath Interconnect (QPI) or the like. In other embodiments, a different interconnect may be used.

In an embodiment, the chipset 2820 is operable to communicate with the processor 2810, 2805N, the display device 2840, and other devices 2872, 2876, 2874, 2860, 2862, 2864, 2866, 2877, etc. The chipset 2820 may also be coupled to a wireless antenna 2878 to communicate with any device configured to at least do one of transmit and receive wireless signals.

The chipset 2820 connects to the display device 2840 via the interface 2826. The display 2840 may be, for example, a liquid crystal display (LCD), a plasma display, cathode ray tube (CRT) display, or any other form of visual display device. In and embodiment, the processor 2810 and the chipset 2820 are merged into a MAA apparatus in a system. Additionally, the chipset 2820 connects to one or more buses 2850 and 2855 that interconnect various elements 2874, 2860, 2862, 2864, and 2866. Buses 2850 and 2855 may be interconnected together via a bus bridge 2872 such as at least one MAA apparatus embodiment. In an embodiment, the chipset 2820 couples with a non-volatile memory 2860, a mass storage device(s) 2862, a keyboard/mouse 2864, and a network interface 2866 by way of at least one of the interface 2824 and 2874, the smart TV 2876, and the consumer electronics 2877, etc.

In an embodiment, the mass storage device 2862 includes, but is not limited to, a solid state drive, a hard disk drive, a universal serial bus flash memory drive, or any other form of computer data storage medium. In one embodiment, the network interface 2866 is implemented by any type of well-known network interface standard including, but not limited to, an Ethernet interface, a universal serial bus (USB) interface, a Peripheral Component Interconnect (PCI) Express interface, a wireless interface and/or any other suitable type of interface. In one embodiment, the wireless interface operates in accordance with, but is not limited to, the IEEE 802.11 standard and its related family, Home Plug AV (HPAV), Ultra Wide Band (UWB), Bluetooth, WiMax, or any form of wireless communication protocol.

While the modules shown in FIG. 28 are depicted as separate blocks within the MAA apparatus embodiment in a computing system 2800, the functions performed by some of these blocks may be integrated within a single semiconductor circuit or may be implemented using two or more separate integrated circuits. For example, although cache memory 2816 is depicted as a separate block within processor 2810, cache memory 2816 (or selected aspects of 2816) can be incorporated into the processor core 2812.

Where useful, the computing system 2800 may have a broadcasting structure interface such as for affixing the MAA apparatus to a cellular tower.

For example, one or more processor cores 2812 may be implemented corresponding to a CPU described in connection with one or more examples described above or below (e.g. FIG. 15) and one or more memory controllers 2814 may be implemented corresponding to a memory controller described in connection with one or more examples described above or below (e.g. FIG. 15). For example, one or more volatile memories 2814 may be implemented corresponding to a memory device (e.g. DIMM or DRAM) described in connection with one or more examples described above or below (e.g. FIG. 1 or 10).

More details, optional features and aspects are mentioned in connection with one or more examples described above or below.

Figure 29:
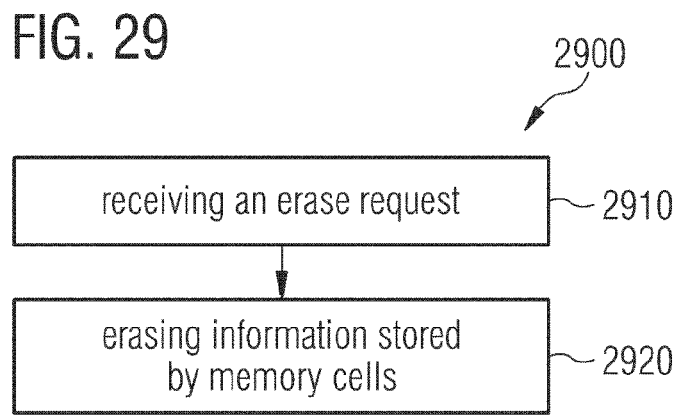
FIG. 29 shows a flow chart of a method for erasing a memory portion of a memory device.

FIG. 29 shows a flow chart of a method for erasing a memory portion of a memory device. The method 2900 comprises receiving 2910 an erase request indicating a memory portion to be erased and erasing 2920 information stored by memory cells of at least a part of the indicated memory portion of the memory device by writing a predefined pattern into the memory cells during an automatic refresh cycle.

More details, optional features and aspects are mentioned in connection with one or more examples described above or below.

Figure 30:
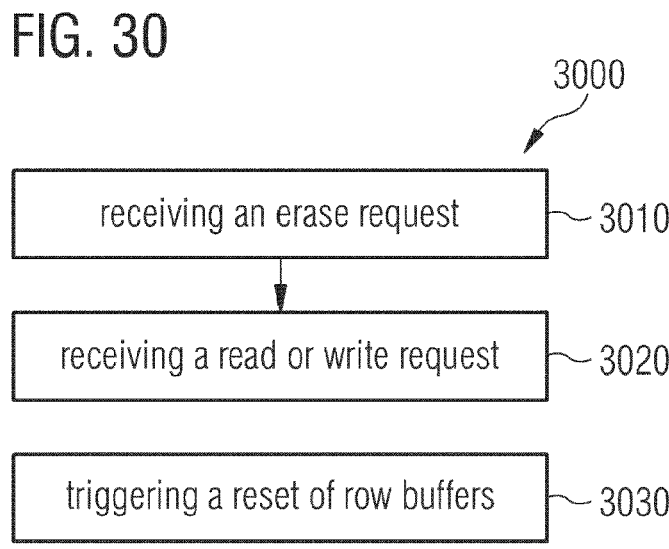
FIG. 30 shows a flow chart of a method for erasing a memory portion of a memory device.

FIG. 30 shows a flow chart of a method for erasing a memory portion of a memory device. The method 3000 comprises receiving 3010 an erase request indicating at least a part of one row of memory cells to be erased and receiving 3020 a read or write request for at least a part of a row of memory cells. Further, the method 3000 comprises triggering 3030 a reset of at least a part of a row buffer of a memory array comprising the row of memory cells indicated by the read or write request based on a predefined pattern during a read or write cycle assigned for the received read or write request and before outputting of information stored by one or more memory cells indicated by the read or write request or before inputting information to be stored by one or more memory cells indicated by the read or write request, if an erase request was received for at least a part of the row of memory cells indicated by the read or write request.

More details, optional features and aspects are mentioned in connection with one or more examples described above or below.

FIG. 31 shows a flow chart of a method for generating an erase request. The method 3100 comprises running 3110 an operating system generating an operating system erase request indicating a high level memory address to be erased and determining 3120 a memory block of a DIMM based on the operating system erase request. Further, the method 3100 comprises generating 3130 a memory controller erase request indicating the determined memory block to be erased during an automatic refresh cycle of the DIMM.

More details, optional features and aspects are mentioned in connection with one or more examples described above or below.

An example (e.g. example 1) relates to a memory device comprising an input interface configured to receive an erase request indicating a memory portion to be erased, and control circuitry configured to trigger erasing information stored by memory cells of at least a part of the indicated memory portion of the memory device by writing a pre-defined pattern into the memory cells during an automatic refresh cycle.

Another example (e.g. example 2) relates to a previously described example (e.g. example 1) further comprising an auxiliary memory configured to store information on memory cells to be erased based on the erase request.

Another example (e.g. example 3) relates to a previously described example (e.g. one of the examples 1-2) further comprising the auxiliary memory being configured to store an erase indication for a plurality of memory blocks based on one or more erase requests, wherein a memory block of the plurality of memory blocks is associated to a plurality of memory cells of the memory device.

Another example (e.g. example 4) relates to a previously described example (e.g. example 3) further comprising the auxiliary memory being configured to store a counter value indicating a number of memory blocks to be erased.

Another example (e.g. example 5) relates to a previously described example (e.g. one of the examples 3-4) further comprising the control circuitry being configured to check whether memory cells scheduled for auto refresh during the automatic refresh cycle are indicated for erasure in the auxiliary memory.

Another example (e.g. example 6) relates to a previously described example (e.g. example 5) further comprising the control circuitry being configured to trigger erasing the information stored by the memory cells scheduled for auto refresh instead of performing the auto refresh during the automatic refresh cycle, if the memory cells scheduled for auto refresh are indicated for erasing in the auxiliary memory.

Another example (e.g. example 7) relates to a previously described example (e.g. one of the examples 3-6) further comprising the control circuitry being configured to trigger an automatic refresh of a batch of rows of memory cells during an automatic refresh cycle, wherein the auxiliary memory is configured to store information indicating whether the rows of the batch of rows of memory cells should be erased by adjacent bits of the auxiliary memory.

Another example (e.g. example 8) relates to a previously described example (e.g. one of the examples 3-7) further comprising the auxiliary memory being an SRAM.

Another example (e.g. example 9) relates to a previously described example (e.g. one of the examples 3-8) further comprising the auxiliary memory and the memory cells to be erased being implemented on the same memory die.

Another example (e.g. example 10) relates to a previously described example (e.g. one of the examples 3-9) comprising a plurality of auxiliary memories, wherein each auxiliary memory of the plurality of auxiliary memories is assigned to an individual memory bank of the memory device.

Another example (e.g. example 11) relates to a previously described example (e.g. one of the examples 3-10) further comprising the auxiliary memory and a micro controller of the memory device being implemented on the same semi-conductor die.

Another example (e.g. example 12) relates to a previously described example (e.g. one of the examples 3-11) further comprising the auxiliary memory being connected to a plurality of memory dies, wherein the auxiliary memory is connected to store information on a first set of memory cells to be erased being located on a first memory die of the plurality of memory dies and a second set of memory cells to be erased being located on a second memory die of the plurality of memory dies.

Another example (e.g. example 13) relates to a previously described example (e.g. one of the examples 1-12) further comprising the control circuitry being configured to trigger erasing information stored by memory cells so that the memory cells are erased while other memory cells of the memory device are refreshed during the automatic refresh cycle.

Another example (e.g. example 14) relates to a previously described example (e.g. one of the examples 1-13) further comprising the memory portion indicated by the erase request comprising one or more rank address blocks identified by one or more rank addresses.

Another example (e.g. example 15) relates to a previously described example (e.g. example 14) further comprising a rank address block comprising at least one row of memory cells.

Another example (e.g. example 16) relates to a previously described example (e.g. one of the examples 1-15) further comprising the received erase request comprising information on the predefined pattern.

Another example (e.g. example 17) relates to a previously described example (e.g. one of the examples 1-16) further comprising the memory cells to be erased being DRAM cells.

Another example (e.g. example 18) relates to a previously described example (e.g. one of the examples 1-17) further comprising the memory device being a DRAM die.

Another example (e.g. example 19) relates to a previously described example (e.g. one of the examples 1-18) further comprising the memory device being a memory module comprising a plurality of DRAM dies.

Another example (e.g. example 20) relates to a previously described example (e.g. one of the examples 1-19) further comprising the memory device being a DIMM.

Another example (e.g. example 21) relates to a previously described example (e.g. one of the examples 1-20) further comprising the predefined pattern comprising only zeros or only ones.

Another example (e.g. example 22) relates to a previously described example (e.g. one of the examples 1-21) further comprising the control circuitry being a micro controller of the memory device.

Another example (e.g. example 23) relates to a previously described example (e.g. one of the examples 1-22) further comprising the automatic refresh cycle being shorter than 100 ms.

An example (e.g. example 24) relates to memory device comprising:

an input interface configured to receive an erase request indicating at least a part of one row of memory cells to be erased, wherein the input interface is further configured to receive a read or write request for at least a part of a row of memory cells; and control circuitry configured to trigger a reset of at least a part of a row buffer of a memory array comprising the row of memory cells indicated by the read or write request based on a predefined pattern during a read or write cycle assigned for the received read or write request and before outputting of information stored by one or more memory cells indicated by the read or write request or before inputting information to be stored by one or more memory cells indicated by the read or write request, if an erase request was received for at least a part of the row of memory cells indicated by the read or write request.

Another example (e.g. example 25) relates to a previously described example (e.g. example 24) further comprising an auxiliary memory configured to store information on memory cells to be erased based on the erase request.

Another example (e.g. example 26) relates to a previously described example (e.g. example 25) further comprising sing the auxiliary memory being configured to store an erase indication for a plurality of memory blocks based on one or more erase requests, wherein a memory block of the plurality of memory blocks is associated to a plurality of memory cells of the memory device.

Another example (e.g. example 27) relates to a previously described example (e.g. example 26) further comprising the auxiliary memory being configured to store a counter value indicating a number of memory blocks to be erased.

Another example (e.g. example 28) relates to a previously described example (e.g. one of the examples 25-27) further comprising the control circuitry being configured to check whether memory cells of the read or write request are indicated for erasure in the auxiliary memory.

Another example (e.g. example 29) relates to a previously described example (e.g. example 28) further comprising the control circuitry being configured to trigger erasing the information stored by the memory cells of the read or write request, if the memory cells of the read or write request are indicated for erasing in the auxiliary memory.

Another example (e.g. example 30) relates to a previously described example (e.g. one of the examples 24-29) further comprising the auxiliary memory being an SRAM.

Another example (e.g. example 31) relates to a previously described example (e.g. one of the examples 24-30) further comprising the auxiliary memory and the memory cells to be erased being implemented on the same memory die.

Another example (e.g. example 32) relates to a previously described example (e.g. one of the examples 24-31) comprising a plurality of auxiliary memories, wherein each auxiliary memory of the plurality of auxiliary memories is assigned to an individual memory bank of the memory device.

Another example (e.g. example 33) relates to a previously described example (e.g. one of the examples 24-32) further comprising the auxiliary memory and a micro controller of the memory device being implemented on the same semiconductor die.

Another example (e.g. example 34) relates to a previously described example (e.g. one of the examples 24-33) further comprising the auxiliary memory being connected to a plurality of memory dies, wherein the auxiliary memory is connected to store information on a first set of memory cells to be erased being located on a first memory die of the plurality of memory dies and a second set of memory cells to be erased being located on a second memory die of the plurality of memory dies.

Another example (e.g. example 35) relates to a previously described example (e.g. one of the examples 24-34) further comprising the memory portion indicated by the erase request comprising one or more rank address blocks identified by one or more rank addresses.

Another example (e.g. example 36) relates to a previously described example (e.g. example 35) further comprising a rank address block comprising at least a part of one row of memory cells.

Another example (e.g. example 37) relates to a previously described example (e.g. one of the examples 24-36) further comprising the received erase request comprising information on the predefined pattern.

Another example (e.g. example 38) relates to a previously described example (e.g. one of the examples 24-37) further comprising the memory cells to be erased being DRAM cells, NAND cells or persistent memory cells.

Another example (e.g. example 39) relates to a previously described example (e.g. one of the examples 24-38) further comprising the memory device being a DRAM die.

Another example (e.g. example 40) relates to a previously described example (e.g. one of the examples 24-39) further comprising the memory device being a memory module comprising a plurality of DRAM dies.

Another example (e.g. example 41) relates to a previously described example (e.g. one of the examples 24-40) further comprising the memory device being a DIMM.

Another example (e.g. example 42) relates to a previously described example (e.g. one of the examples 24-41) further comprising the predefined pattern comprising only zeros or only ones.

Another example (e.g. example 43) relates to a previously described example (e.g. one of the examples 24-42) further comprising the control circuitry being a micro controller of the memory device.

An example (e.g. example 44) relates to a computing system comprising:

one or more CPUs configured to run an operating system generating an operating system erase request indicating a high level memory address to be erased; and one or more memory controllers configured to determine a memory block of a DIMM based on the operating system erase request and generate a memory controller erase request indicating the memory block to be erased during an automatic refresh cycle or read/write cycle of the DIMM.

Another example (e.g. example 45) relates to a previously described example (e.g. example 44) further comprising the one or more memory controllers comprising a first memory controller and a second memory controller, wherein the first memory controller is configured to determine a first memory block of a first MINIM based on the operating system erase request and generate a first memory controller erase request indicating the first memory block to be erased during an automatic refresh cycle of the first DIMM, wherein the second memory controller is configured to determine a second memory block of a second DIMM based on the operating system erase request and generate a second memory controller erase request indicating the second memory block to be erased during an automatic refresh cycle of the second DIMM.

Another example (e.g. example 46) relates to a previously described example (e.g. one of the examples 44-45) comprising the memory controller erase request comprising memory stack information, memory bank group information, memory bank information and memory row information for at least a part of the memory block to be erased.

Another example (e.g. example 47) relates to a previously described example (e.g. one of the examples 44-46) comprising the memory controller erase request comprising information on a predefined pattern to be used for erasing the memory block by writing the predefined pattern into memory cells of the memory block to be erased.

Another example (e.g. example 48) relates to a previously described example (e.g. one of the examples 44-47) comprising the computing system being configured to determine during boot time that at least one memory module is capable of erasing memory cells during automatic refresh.

Another example (e.g. example 49) relates to a previously described example (e.g. one of the examples 44-48) comprising the high level memory address being a physical memory address visible for the operating system.

Another example (e.g. example 50) relates to a previously described example (e.g. one of the examples 44-49) comprising the operating system generating the operating system erase request after closing an executed service, wherein the high level memory address was assigned to the service.

Another example (e.g. example 51) relates to a previously described example (e.g. one of the examples 44-50) comprising the high level memory address being mapped to one or more rank address blocks by the one or more memory controllers.

An example (e.g. example 52) relates to a method for erasing a memory portion of a memory device, the method comprising:

receiving an erase request indicating a memory portion to be erased; and erasing information stored by memory cells of at least a part of the indicated memory portion of the memory device by writing a predefined pattern into the memory cells during an automatic refresh cycle.

An example (e.g. example 53) relates to a method for erasing a memory portion of a memory device, the method comprising:

receiving an erase request indicating at least a part of one row of memory cells to be erased;

receiving a read or write request for at least a part of a row of memory cells; and triggering a reset of at least a part of a row buffer of a memory array comprising the row of memory cells indicated by the read or write request based on a predefined pattern during a read or write cycle assigned for the received read or write request and before outputting of information stored by one or more memory cells indicated by the read or write request or before inputting information to be stored by one or more memory cells indicated by the read or write request, if an erase request was received for at least a part of the row of memory cells indicated by the read or write request.

An example (e.g. example 54) relates to a method for generating an erase request, the method comprising:

running an operating system generating an operating system erase request indicating a high level memory address to be erased;

determining a memory block of a DIMM based on the operating system erase request; and generating a memory controller erase request indicating the determined memory block to be erased during an automatic refresh cycle of the DIMM.

An example (e.g. example 55) relates to a machine-readable storage medium including program code, when executed, to cause a machine to perform the method of one of a previous example.

An example (e.g. example 56) relates to a computer program having a program code for performing the method of a previous example, when the computer program is executed on a computer, a processor, or a programmable hardware component.

The aspects and features described in relation to a particular one of the previous examples may also be combined with one or more of the further examples to replace an identical or similar feature of that further example or to additionally introduce the features into the further example.

Examples may further be or relate to a (computer) program including a program code to execute one or more of the above methods when the program is executed on a computer, processor or other programmable hardware component. Thus, steps, operations or processes of different ones of the methods described above may also be executed by programmed computers, processors or other programmable hardware components. Examples may also cover program storage devices, such as digital data storage media, which are machine-, processor- or computer-readable and encode and/or contain machine-executable, processor-executable or computer-executable programs and instructions. Program storage devices may include or be digital storage devices, magnetic storage media such as magnetic disks and magnetic tapes, hard disk drives, or optically readable digital data storage media, for example. Other examples may also include computers, processors, control units, (field) programmable logic arrays ((F)PLAs), (field) programmable gate arrays ((F)PGAs), graphics processor units (GPU), application-specific integrated circuits (ASICs), integrated circuits (ICs) or system-on-a-chip (SoCs) systems programmed to execute the steps of the methods described above.

It is further understood that the disclosure of several steps, processes, operations or functions disclosed in the description or claims shall not be construed to imply that these operations are necessarily dependent on the order described, unless explicitly stated in the individual case or necessary for technical reasons. Therefore, the previous description does not limit the execution of several steps or functions to a certain order. Furthermore, in further examples, a single step, function, process or operation may include and/or be broken up into several sub-steps, -functions, -processes or -operations.

If some aspects have been described in relation to a device or system, these aspects should also be understood as a description of the corresponding method. For example, a block, device or functional aspect of the device or system may correspond to a feature, such as a method step, of the corresponding method. Accordingly, aspects described in relation to a method shall also be understood as a description of a corresponding block, a corresponding element, a property or a functional feature of a corresponding device or a corresponding system.

The following claims are hereby incorporated in the detailed description, wherein each claim may stand on its own as a separate example. It should also be noted that although in the claims a dependent claim refers to a particular combination with one or more other claims, other examples may also include a combination of the dependent claim with the subject matter of any other dependent or independent claim. Such combinations are hereby explicitly proposed, unless it is stated in the individual case that a particular combination is not intended. Furthermore, features of a claim should also be included for any other independent claim, even if that claim is not directly defined as dependent on that other independent claim.

The invention claimed is:

1. A memory device comprising:
an input interface configured to receive an erase request indicating a memory portion to be erased; and
control circuitry configured to trigger erasing information stored by memory cells of at least a part of the indicated memory portion of the memory device by writing a predefined pattern into the memory cells during an automatic refresh cycle.

2. The memory device of claim 1, further comprising an auxiliary memory configured to store information on memory cells to be erased based on the erase request.

3. The memory device of claim 1, wherein the auxiliary memory is configured to store an erase indication for a plurality of memory blocks based on one or more erase requests, wherein a memory block of the plurality of memory blocks is associated to a plurality of memory cells of the memory device.

4. The memory device of claim 3, wherein the control circuitry is configured to check whether memory cells scheduled for auto refresh during the automatic refresh cycle are indicated for erasure in the auxiliary memory.

5. The memory device of claim 4, wherein the control circuitry is configured to trigger erasing the information stored by the memory cells scheduled for auto refresh instead of performing the auto refresh during the automatic refresh cycle, if the memory cells scheduled for auto refresh are indicated for erasing in the auxiliary memory.

6. The memory device of claim 3, wherein the control circuitry is configured to trigger an automatic refresh of a batch of rows of memory cells during an automatic refresh cycle, wherein the auxiliary memory is configured to store information indicating whether the rows of the batch of rows of memory cells should be erased by adjacent bits of the auxiliary memory.

7. The memory device of claim 3, wherein the auxiliary memory is an SRAM.

8. The memory device of claim 3, wherein the auxiliary memory and the memory cells to be erased are implemented on the same memory die.

9. The memory device of claim 3, comprising a plurality of auxiliary memories, wherein each auxiliary memory of the plurality of auxiliary memories is assigned to an individual memory bank of the memory device.

10. The memory device of claim 3, wherein the auxiliary memory and a micro controller of the memory device are implemented on the same semiconductor die.

11. The memory device of claim 3, wherein the auxiliary memory is connected to a plurality of memory dies, wherein the auxiliary memory is connected to store information on a first set of memory cells to be erased being located on a first memory die of the plurality of memory dies and a second set of memory cells to be erased being located on a second memory die of the plurality of memory dies.

12. The memory device of claim 1, wherein the control circuitry is configured to trigger erasing information stored by memory cells so that the memory cells are erased while other memory cells of the memory device are refreshed during the automatic refresh cycle.

13. The memory device of claim 1, wherein the memory portion indicated by the erase request comprises one or more rank address blocks identified by one or more rank addresses.

14. The memory device of claim 13, wherein a rank address block comprises at least a part of one row of memory cells.

15. The memory device of claim 1, wherein the received erase request comprises information on the predefined pattern.

16. The memory device of claim 1, wherein the memory cells to be erased are DRAM cells.

17. The memory device of claim 1, wherein the memory device is a DRAM die.

18. The memory device of claim 1, wherein the memory device is a memory module comprising a plurality of DRAM dies.

19. A memory device comprising:
an input interface configured to receive an erase request indicating at least a part of one row of memory cells to be erased, wherein the input interface is further configured to receive a read or write request for at least a part of a row of memory cells; and
control circuitry configured to trigger a reset of at least a part of a row buffer of a memory array comprising the row of memory cells indicated by the read or write request based on a predefined pattern during a read or write cycle assigned for the received read or write request and before outputting of information stored by one or more memory cells indicated by the read or write request or before inputting information to be stored by one or more memory cells indicated by the read or write request, if an erase request was received for at least a part of the row of memory cells indicated by the read or write request.

20. A computing system comprising:
one or more CPUs configured to run an operating system generating an operating system erase request indicating a high level memory address to be erased; and
one or more memory controllers configured to determine a memory block of a DIMM based on the operating system erase request and generate a memory controller erase request indicating the memory block to be erased during an automatic refresh cycle or read/write cycle of the DIMM.

* * * * *